(12) United States Patent
Lesso et al.

(10) Patent No.: US 8,742,970 B2
(45) Date of Patent: Jun. 3, 2014

(54) ANALOGUE-TO-DIGITAL CONVERTER

(71) Applicant: Wolfson Microelectronics plc, Edinburgh (GB)

(72) Inventors: John Paul Lesso, Edinburgh (GB); John Laurence Pennock, Midlothian (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 13/902,638

(22) Filed: May 24, 2013

(65) Prior Publication Data

US 2013/0321190 A1    Dec. 5, 2013

Related U.S. Application Data

(60) Provisional application No. 61/653,238, filed on May 30, 2012.

(51) Int. Cl.
*H03M 1/60* (2006.01)
*H03M 1/00* (2006.01)
*H03M 1/12* (2006.01)

(52) U.S. Cl.
CPC .............. *H03M 1/00* (2013.01); *H03M 1/1225* (2013.01); *H03M 2201/4233* (2013.01); *H03M 1/12* (2013.01)
USPC .......................................... 341/157; 341/158

(58) Field of Classification Search
CPC ................ H03M 1/00; H03M 1/1225; H03M 2201/4233; H03M 1/12
USPC ................... 341/157, 158, 141, 165, 166, 155
See application file for complete search history.

(56) References Cited

U.S. PATENT DOCUMENTS

| | | | |
|---|---|---|---|
| 5,396,247 A | 3/1995 | Watanabe et al. | |
| 7,030,803 B2 | 4/2006 | Harada et al. | |
| 7,142,140 B2 * | 11/2006 | Storvik et al. | 341/141 |
| 7,330,144 B2 | 2/2008 | Terazawa et al. | |
| 2012/0075137 A1 | 3/2012 | Tanizawa | |
| 2012/0112945 A1 | 5/2012 | Hashimoto | |

* cited by examiner

*Primary Examiner* — Joseph Lauture
(74) *Attorney, Agent, or Firm* — Dickstein Shapiro LLP

(57) ABSTRACT

An apparatus and method for regulating analogue-to-digital converters. First and second input signals are received at controlled oscillator circuitry which generates respective first and second pulse streams with pulse rates based on the relevant input signal. Difference circuitry determines the difference in number of pulses of the first and second pulse streams and outputs a first digital signal. Circuitry also determines a signal independent value based on the number of pulses of the first and/or second pulse streams. In one embodiment this value is the sum or average of the number of pulses of the first and second pulse streams. This value can be used to calibrate for any variation in transfer characteristic of the oscillator circuitry. In one embodiment this value is compared to a reference value and a regulation signal passed to control circuitry to regulate the operation of the oscillation circuitry.

30 Claims, 13 Drawing Sheets

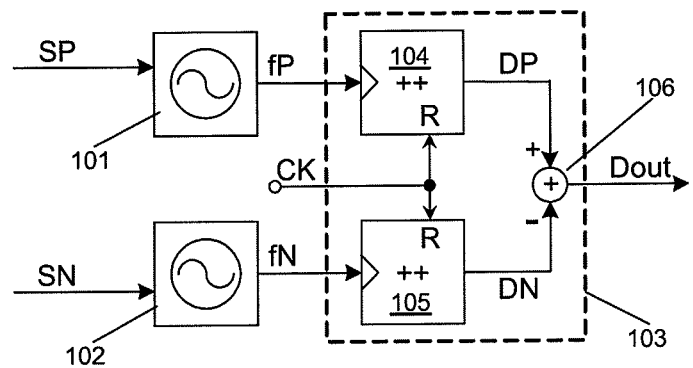
Figure 1 – PRIOR ART
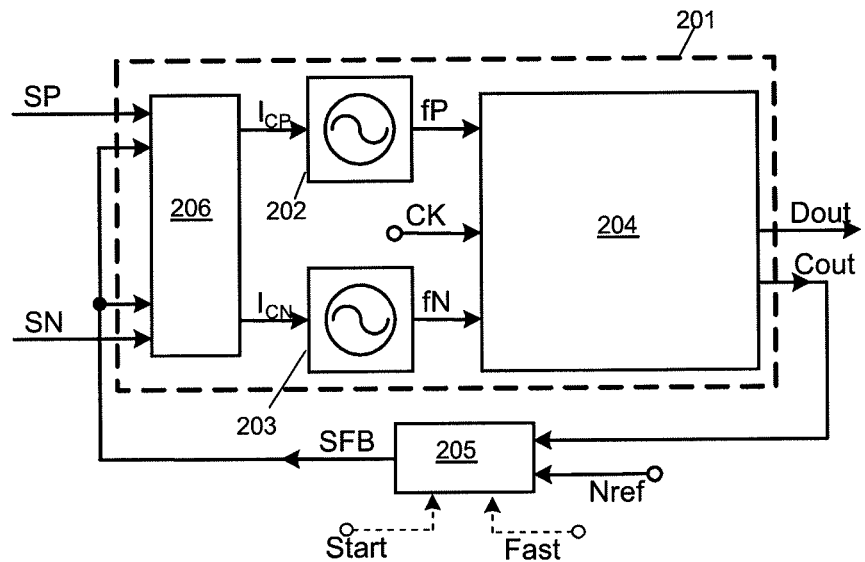
Figure 2
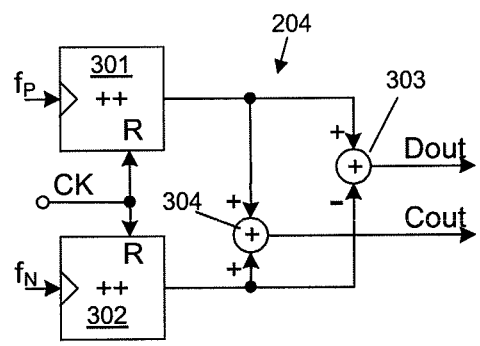
Figure 3

ANALOGUE-TO-DIGITAL CONVERTER

This application claims the benefit of U.S. Provisional Application No. 61/653,238, filed on May 30, 2012, the disclosure of which is incorporated by reference herein in its entirety.

BACKGROUND OF THE INVENTION

1. Field of the Invention The present application relates to analogue-to-digital converters having controlled oscillators and to apparatus and methods for regulating an analogue-to-digital converter to account for, or provide, a variation in oscillator transfer characteristic.

2. Description of the Related Art

Analogue-to-Digital converters (ADCs) using voltage controlled oscillators (VCOs) are known. FIG. 1 shows an example of a conventional ADC for differential input signals that produces a digital output based on the difference between two analogue input signals. The differential analogue input signals, SP and SN, are received by respective VCOs 101 and 102 respectively. Each VCO 101, 102 outputs a steam of pulses at a pulse rate or frequency which is dependent on the input voltage, i.e. the respective input signal SP or SN. First and second pulse streams, at frequencies fP and fN respectively are thus produced by VCOs 101 and 102. The two pulse streams are supplied to difference circuitry 103 which determined the difference in the pulse rates or frequencies fP, fN. The difference circuitry comprises first and second counters 104 and 105 which count the number of pulses in a period defined by a clock signal CK to produce digital count values DP and DN respectively. These digital count values DP, DN are subtracted 106 to give the digital output value Dout.

The counters 104 and 105 may either be periodically sampled and reset, in which case the difference in their sampled counts, Dout, is then a direct digital representation of the difference between the input signals SP, SN. Alternatively, for some applications, such as the integrator of a sigma-delta ADC, the counters may run continuously, in which case the difference count is a digital representation of the integrated input signal difference.

One problem with this type of ADC, especially when formed as, or as part of, an integrated circuit (IC), is that the VCO transfer characteristic from input voltage to output frequency may have wide manufacturing tolerances. Thus, the frequency output for a given defined input signal may be unpredictable from IC-to-IC and/or wafer-to-wafer and hence the scale factor or gain of the ADC, i.e. the digital output for a given known input, may be unpredictable. Also the VCO transfer characteristic may be temperature dependent thus meaning that the gain or scale factor may vary in use.

Embodiments of the present invention mitigate at least some of the above mentioned problems.

SUMMARY OF THE INVENTION

Thus according to an aspect of the present invention there is provided an analogue-to-digital converter for receiving first and second analogue input signals, comprising;
  controlled oscillator circuitry for generating first and second pulse streams with pulse rates dependent on the first and second input signals respectively;
  difference circuitry for generating a first digital signal based on the difference in number of pulses of the first and second pulse streams; and
  regulation circuitry for generating a regulation signal for modulating the operating conditions of the oscillator circuitry so as to modulate the pulse rates of the first and second pulse streams;
  wherein the regulation circuitry is configured to generate a first value based on the number of pulses of the first and/or second pulse streams; and
  the regulation signal is based on the first value.

In a second aspect there is provided an analogue-to-digital converter for receiving first and second analogue input signals, comprising;
  controlled oscillator circuitry for generating first and second pulse streams with pulse rates dependent on the first and second input signals respectively;
  difference circuitry for generating a first digital signal based on the difference in number of pulses of the first and second pulse streams; and
  regulation circuitry for generating a regulation signal for modulating the first digital signal to provide a digital output;
  wherein the regulation circuitry is configured to generate a first value based on the number of pulses of the first and/or second pulse streams; and
  the regulation signal is based on the first value.

In a further aspect there is provided an analogue-to-digital converter for receiving first and second analogue input signals, comprising;
  controlled oscillator circuitry for generating first and second pulse streams with pulse rates dependent on the first and second input signals respectively;
  difference circuitry, responsive to a clock signal, for generating a first digital signal based on the difference in number of pulses of the first and second pulse streams in a count period defined by the clock signal; and
  regulation circuitry for generating a regulation signal for modulating the clock signal period;
  wherein the regulation circuitry is configured to generate a first value based on the number of pulses of the first and/or second pulse streams; and
  the regulation signal is based on the first value.

In a yet further aspect there is provided an analogue-to-digital converter for receiving first and second analogue input signals, comprising;
  controlled oscillator circuitry for generating first and second pulse streams with pulse rates dependent on the first and second input signals respectively;
  difference circuitry responsive to a clock signal for generating a first digital signal based on the difference in number of pulses of the first and second pulse streams; and
  regulation circuitry for generating a regulation signal for modulating the operating conditions of the controlled oscillator circuitry so as to modulate the pulse rates of the first and second pulse streams and/or for modulating the clock signal;
  wherein the regulation signal varies based on an indication of the amplitude of the first and/or second input signals.

In another aspect there is provided an analogue-to-digital converter for receiving first and second input analogue signals, comprising;
  controlled oscillator circuitry for generating first and second pulse streams with pulse rates dependent on the first and second input signals respectively;
  difference circuitry, responsive to a clock signal, for generating a first digital signal based on the difference in number of pulses of the first and second pulse streams; and regulation circuitry for generating a regulation signal for modulating at least one of:
the operating conditions of the oscillator circuitry so as to modulate the pulse rate of at least one of the first and second pulse streams;
the clock signal; or
the first digital signal;
wherein the regulation circuitry is configured to generate a first value based on the number of pulses of the first and/or second pulse streams; and
the regulation signal is based on the first value.

In general there is provided an analogue-to-digital converter for receiving first and second input analogue signals, comprising;
controlled oscillator circuitry for generating first and second pulse streams with pulse rates dependent on the first and second input signals respectively;
difference circuitry for generating a first digital signal based on the difference in number of pulses of the first and second pulse streams; and
gain control circuitry for modulating the operation of the converter so as to modulate the gain of the converter;
wherein the gain control circuitry modulates the operation of the converter based on the number of pulses of the first and/or second pulse streams.

The invention also relates to methods of analogue to digital conversion. Thus in a further aspect there is provided a method of analogue-to-digital conversion comprising:
receiving first and second analogue input signals;
generating first and second pulse streams with pulse rates dependent on the first and second input signals respectively;
generating a first digital signal based on the difference in number of pulses of the first and second pulse streams; and
regulating the operation of the converter so as to modulate the gain of the converter;
wherein the gain of the converter is modulated based on the number of pulses of the first and/or second pulse streams.

In a yet further aspect there is provided a method of analogue-to-digital conversion comprising:
receiving first and second analogue input signals;
generating, using controlled oscillator circuitry, first and second pulse streams with pulse rates dependent on the first and second input signals respectively;
generating a first digital signal based on the difference in number of pulses of the first and second pulse streams in a period defined by a clock signal;
generating a regulation signal based on an indication of the amplitude of the first and/or second input signals; and
using the regulation signal to modulate the operation of the controlled oscillator circuitry to modulate the pulse rates of at least one of the first and second pulse streams and/or using the regulation signal to modulate the clock signal.

BRIEF DESCRIPTION OF THE DRAWINGS

The invention will now be described by way of example only, with reference to the following drawings, of which:
FIG. 1 illustrates a conventional differential signal ADC;
FIG. 2 illustrates an ADC according to an embodiment of the present invention;
FIG. 3 illustrates one embodiment of circuitry for determining the difference and sum of the pulse numbers in first and second pulse streams.

DETAILED DESCRIPTION OF THE PREFERRED EMBODIMENTS

Figure 4:
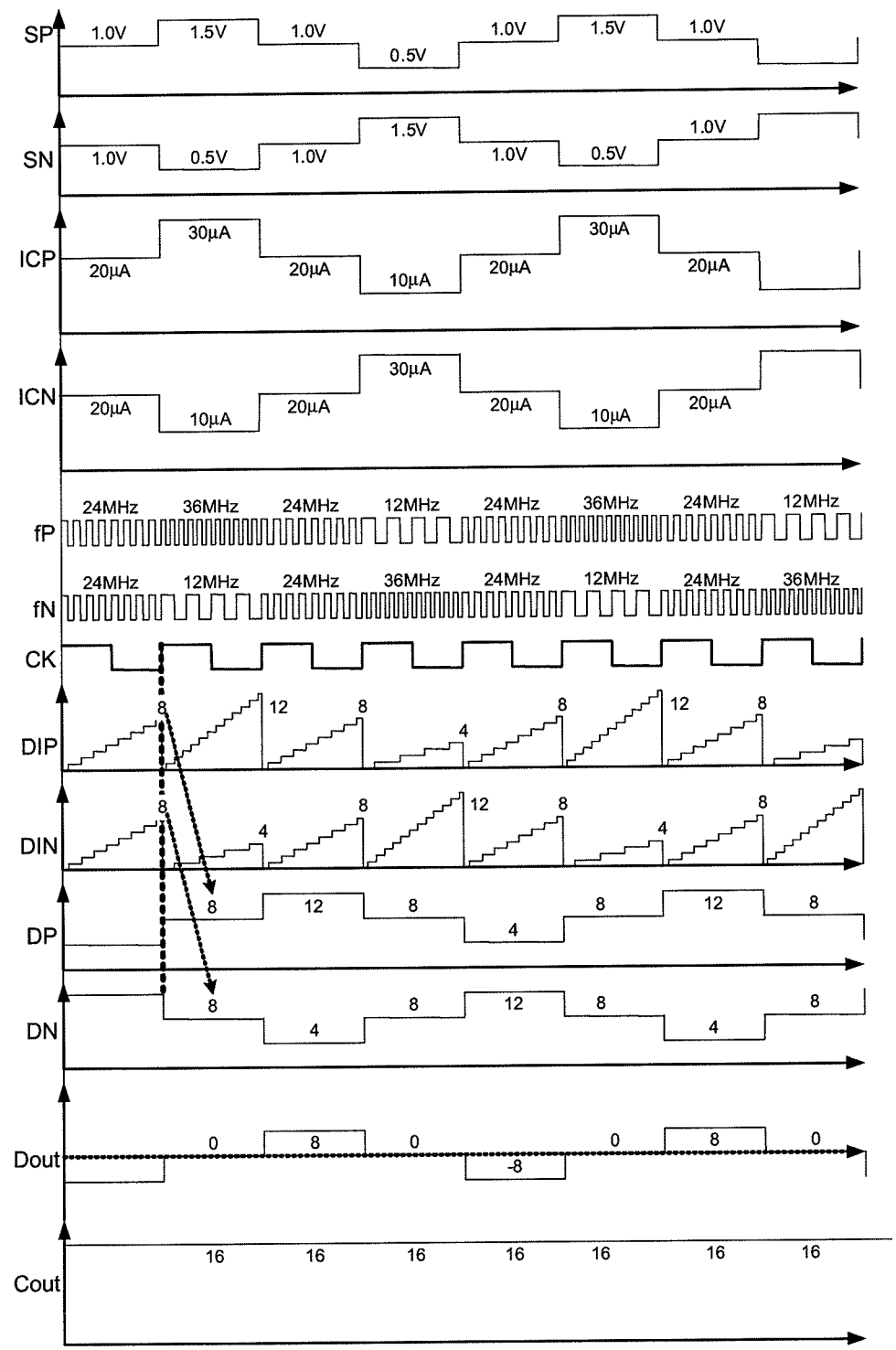
FIG. 4 illustrates a simple example of waveforms that may be generated in the various components of FIGS. 2 and 3.

Embodiments of the present invention provide analogue-to-digital converters (ADCs) for receiving first and second input analogue signals, with controlled oscillator circuitry for generating first and second pulse streams with pulse rates dependent on the first and second input signals respectively and difference circuitry for generating a first digital signal based on the difference in number of pulses of the first and second pulse streams.

As described above, for known VCO based ADCs such as shown in FIG. 1, a variation in transfer characteristic of the VCO can lead to an unpredictable and varying digital output. As described earlier a first digital signal, Dout, is based on the difference of the number of pulses in the first and second pulse streams in a given count period. In some embodiments the first digital signal Dout may be used directly as the output of the ADC whereas in other embodiments there may be some processing or remodulation of the first digital signal before output—but the value of the output clearly depends on the first digital signal.

As the number of pulses in a pulse stream is equal to the count period multiplied by the pulse rate or frequency the first digital signal, Dout, is given by;

$$Dout = T \cdot (fP - fN) \qquad \text{Eqn. 1}$$

where T is the count period.

The pulse rate fP of the first pulse stream depends on the input signal SP and the transfer characteristic, $K_{VCO}$, of the VCO 101. Likewise pulse rate fN of the second pulse stream is based on the signal level SN and the transfer characteristic, $K_{VCO}$, of the VCO 102. Where both VCOs 101 and 102 are part of the same integrated circuit the transfer characteristic for both VCOs will be substantially the same as any manufacturing variations will apply to both VCOs substantially equally and the operating conditions such as temperature will be substantially the same.

If the VCO transfer characteristic, $K_{VCO}$, is substantially linear over the operating range of the ADC then the pulse rate of the first pulse stream at any instant is:

$$fP = f_q + m \cdot SP \qquad \text{Eqn. 2}$$

where $f_q$ is the frequency of the VCO when the input signal SP level is zero (i.e. the quiescent VCO frequency) and m is a gradient of the transfer characteristic. Likewise the pulse rate, fN is given by:

$$fN = f_q + m \cdot SN \qquad \text{Eqn. 3}$$

It can therefore be seen from equations 1, 2 and 3 that the first digital signal, Dout is given by:

$$Dout = T \cdot m \cdot (\Delta S) \qquad \text{Eqn. 4}$$

where ΔS is equal to the differential input signal (SP−SN).

However, the transfer characteristic of the VCOs may vary from a nominal characteristic in that the gradient, m, and possibly the VCO quiescent frequency $f_q$ may vary from nominal values.

Clearly it can be seen from equation 4 that if there is any significant difference between the gradient m of the actual transfer characteristic and the gradient (m') of the nominal transfer characteristic the digital output signal may differ from what would be expected for a given input signal level SP−SN which is non-zero.

In embodiments of the invention the ADC comprises regulation circuitry for regulating operation of the ADC. In some embodiments the regulation circuitry is gain control circuitry for modulating the gain of the ADC based on the number of pulses of the first and/or second pulse streams, for example such that a given input signal produces a desired output digital value. In this way the operation of the converter can be regulated for any difference in transfer characteristic of the controlled oscillator circuitry from an expected value, i.e. calibrated. Embodiments of the present invention generate a regulation signal based on first value, which is based on the number of pulses or the first and/or second pulse stream, where the regulation signal can be used to modulate the operation of the ADC.

The first value may be a signal independent value. In some embodiments the regulation signal is generated based on the sum or average of the number of pulses of the first and second pulse streams.

The present inventors have realised that when the input signal is a typical differential signal then SP and SN have substantially equal and opposite modulations about a reference signal level SR. Thus:

$$SP = SR + \Delta S/2 \quad SN = SR - \Delta S/2 \qquad \text{Eqn. 5}$$

where SR is the reference signal level corresponding to a zero level differential input, i.e. when SP and SN are equal (SP=SN=SR). In some cases the input signals may be arranged such that zero level differential signal occurs when both SP and SN are equal to zero, however in some embodiments SR may be a non-zero analogue signal level.

As described above the counter 104 generates a digital count value DP by counting the number of pulses of the first pulse stream in a given count period. Expressing this in terms of the differential signals:

$$DP = T \cdot (f_q + m \cdot (SR + \Delta S/2)) \qquad \text{Eqn. 6}$$

As the signal level SR is a fixed reference level (which may in some embodiments be zero) the count value DP can be rewritten as:

$$DP = T \cdot (f_0 + m \cdot \Delta S/2) \qquad \text{Eqn. 7}$$

where $f_0$ is equal to the frequency produced by the VCO 101 when the differential input signal is zero, i.e. when SP=SN=SR. The frequency $f_0$ produced by the VCO 101 when the differential input signal is zero will be referred to herein as the centre frequency. The count value, DN, produced by counter 105 is likewise:

$$DN = T \cdot (f_0 - m \cdot \Delta S/2) \qquad \text{Eqn. 8}$$

The difference in these two count values gives the digital output value (i.e. the value of the first digital signal) as set out in equation 4 above. However the sum of these count values, Cout, is equal to:

$$Cout = DP + DN = 2 \cdot T \cdot f_0 \qquad \text{Eqn. 9}$$

It can be seen that Cout corresponds to twice the value of the pulse count that would be expected, with the actual VCO transfer characteristic, if the input signal level was a differential input of zero, i.e. the count value that would be expected (either DP or DN) were SP equal to SN (and both equal to SR).

The sum of the individual pulse counts DP and DN is thus proportional to the pulse count that would be expected, for the current transfer characteristic, for a defined input signal level, irrespective of whatever the present signal level is. This value, Gout, is therefore independent of the present value of input signal and can be used to determine and/or correct for the actual transfer characteristic and any departure from a nominal transfer characteristic.

In some embodiments the value Cout (or other input signal independent value derived from the number of pulses of the first and/or second pulse streams) may be used to generate a regulation signal which is used as a feedback signal to modulate the operation of the ADC. In one embodiment the regulation signal is used as to modulate the operating conditions of the oscillator circuitry, as shown in FIG. 2.

FIG. 2 shows an ADC circuit 201 having first and second controlled oscillators 202 and 203 respectively for producing first and second pulse streams based on first and second input signals SP and SN respectively. The first and second pulse streams are received by circuitry 204 which determines the difference between the number of pulses of each pulse stream and outputs a first digital signal Dout. In addition however the circuitry 204 also produces a value Cout which, as described above may be the sum (or average) of the number of pulses in both pulse streams.

As mentioned previously the value Cout is proportional to the count value that would be expected, based on the then current transfer characteristic of the oscillators 202 and 203, were the input signal to be a zero-level differential input i.e. SP=SN. The value Cout is thus compared by circuitry 205, which forms part of the regulation circuitry of the ADC, with a reference value Nref representing the count value expected for a zero level input signal with a nominal or desired transfer characteristic.

The result of the comparison by circuitry 205 may be a feedback signal, SFB, which can be used as a regulation signal to modulate the operating conditions of the oscillators.

In the embodiment shown in FIG. 2 control circuitry 206 is arranged to receive the regulation signal SFB and adjust the input signals received by the oscillators 202 and 203 so as to modulate, i.e. adjust, the operating conditions thereof.

In one embodiment the oscillators 202 and 203 are current controlled oscillators and the control circuitry 206 receives the input signals SP and SN and the regulation signal SFB and generates appropriate control currents $I_{CP}$ and $I_{CN}$ as will be described in more detail later.

FIG. 3 shows one embodiment of circuitry 204 for determining Dout and Cout. The circuitry comprises two counters 301 and 302 for receiving the first and second pulse streams fP, fN respectively. As described previously these counters 301, 302 may be sampled and reset based on a clock signal CK to define a count period. A subtractor 303 receives the count value from counter 301 and subtracts the count value from counter 302 to generate Dout. An adder 304 (which is part of the regulation circuitry of the ADC) also receives the count values from both counters and sums the values to produce Cout.

To illustrate the principles of operation, FIG. 4 illustrates the various waveforms on the various signal paths of a simplified embodiment based on that shown in FIG. 2 with difference/regulation circuitry as shown in FIG. 3 but ignoring the effect of the feedback regulation signal SFB.

FIG. 4 illustrates the input signals SN and SP, which in this simple example are assumed to be sample-and-held synchronously with a clock signal CK and moving between three different voltage levels, 0.5V, 1.0V and 1.5V with the reference signal level (i.e. SP=SR) equal to 1.0V. Signals SP and SN are inverse signals about the reference signal level.

FIG. 4 also illustrates these input voltage signal levels being converted to corresponding control current signals $I_{CP}$ and $I_{CN}$ and the resulting pulse stream frequencies fP and fN.

It can be seen that the pulse rate/frequency is centred on 24 MHz (i.e. this is the centre frequency) and swings between 12 MHz and 36 MHz.

FIG. 4 also illustrates how the internal counts, DIP and DIN, within counters 301 and 302 increment during the count period defined by the clock signal CK. The count value increments by one at each falling edge of the input pulse stream and is reset at the end of each clock period. The resulting count values, DP and DN, are also output at the end of each count period. It will be seen that in this simple example the count value varies between a count of 4, 8 or 12 with a count of 8 when SP=SN=1.0V.

Finally FIG. 4 illustrates the resulting value of Dout (ignoring any propagation delays) and also the value of Cout. It will be seen that whilst Dout varies in accordance with the input signals SP and SN the value of Cout is constant, whatever the input signals SP and SN, and the value of Cout is equal to 16, which is twice the count value DP or DN actually produced for a differential input signal of zero.

It will be appreciated that in this simple example the oscillator centre frequency, $f_0$, is only eight times the frequency of the clock signal CK. In reality for many applications it may be desired to have lower or higher count values for a zero-level differential signal so as to give lower or higher resolution and thus $f_0$, may, for higher resolution, be greater than the frequency of CK. It will also of course be appreciated that the values of Cout and Dout will depend on the nominal transfer function between the input voltage level of SP and SN and the corresponding current levels, $I_{CP}$ and $I_{CN}$.

In operation the signal independent value Cout may therefore be compared to a reference value Nref based on the desired count value for an input signal level of 1.0 v, i.e. for a zero-level differential input where SP=SN=SR, to generate the regulation signal. In this example, where Gout is the sum of the count values DP+DN, the value Nref may be twice the desired count value. The difference between Nref and Cout can be used to generate an appropriate regulation feedback signal SFB.

Figure 5:
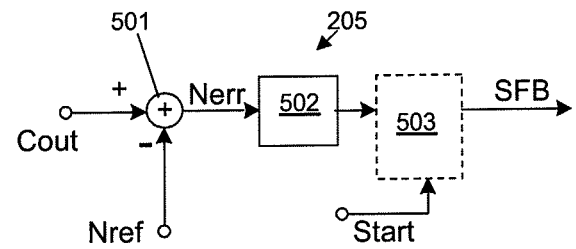
FIG. 5 illustrates one embodiment of comparison circuitry suitable for use in embodiments of the present invention.

FIG. 5 shows one embodiment of suitable regulation circuitry 205 used in the feedback path. The reference value Nref is subtracted 501 from the value Cout and the resultant error value Nerr may be input to a suitable logic 502, such as a look-up table (LUT), that determines a suitable value of feedback signal SFB, i.e. the logic 502 maps the output of computational circuitry 501 to an appropriate regulation signal. It will be appreciated however that the reference value could be built into the LUT and the value Cout may be used directly and/or there may be one or more signal conditioning blocks such as a low-pass filter (LPF) for example.

In some embodiments the regulation circuitry 205 may be responsive to a control signal, Start, to start regulation. The Start signal may, for example, be asserted at power-on or reset of the ADC to initiate calibration. In some embodiments the calibration may be performed only on start-up or reset. Such an initial calibration may be a single shot calibration, i.e. a single value of Gout is obtained and used to generate an appropriate regulation signal SFB. For more accurate calibration, samples of Cout measured over several successive CK periods may be accumulated to give a more accurate estimate. This could be achieved by gating the clock signal to the existing counters, i.e. to allow the counters to count for several CK periods (for which obviously the counters will need to be implemented with enough bits to allow the extra count), or by arranging an accumulator in the feedback path. Alternatively calibration may be performed for a short time following assertion of the start signal with the regulation signal being refined over a few clock periods. In any case the regulation signal SFB that is derived may be latched or stored to be used in subsequent operation.

In other embodiments however the regulation circuitry operates continuously or periodically throughout operation of the ADC.

Whether the calibration is performed only on start-up or continuously, an initial value for the regulation signal SFB may be used on start-up to reduce the time required to generate a stable regulation signal. Thus, as shown in FIG. 5 there may be a logic block 503, such as a register, which pre-sets the regulation signal to an initial value on assertion of the start signal. This initial value of the regulation signal may be a predetermined default value or it may be a value stored in memory from previous operation of the regulation circuitry. Thus the ADC regulation circuitry may be arranged to store a present value of regulation signal in a suitable memory to be used as an initial value following a period of power-off or a reset.

Figure 6:
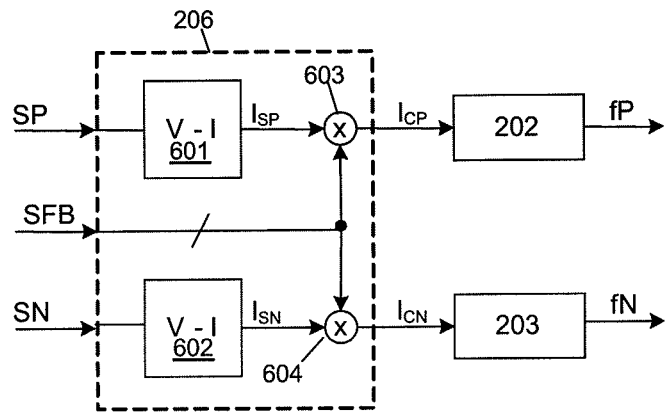
FIG. 6 illustrates an example of current control circuitry suitable for use in embodiments of the present invention.
Figure 7:
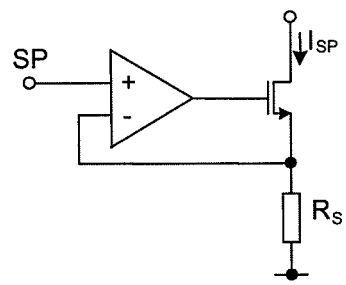
FIG. 7 illustrates an example of a voltage-to-current converter suitable for use in embodiments of the present invention.

Referring back to FIG. 2 the feedback signal SFB may be used by control circuitry 206 to modulate a control current supplied to current controlled oscillators 202 and 203. Thus in effect the control circuitry adjusts the first and second input signals used to control the oscillation circuitry. FIG. 6 shows one embodiment of suitable control circuitry comprising voltage-to-current converters 601 and 602 for receiving input signals SP and SN and producing corresponding currents $I_{SP}$ and $I_{SN}$ respectively. FIG. 7 shows one embodiment of a suitable voltage-to-current converter 601.

The signal currents $I_{SP}$ and $I_{SN}$ produced by the voltage-to-current converters 601 and 602 are then modulated based on the regulation signal SFB. In one embodiment the adjustment may be a multiplication and thus multipliers 603 and 604 are arranged to multiply the signal currents based on the regulation signal to provide control currents $I_{CP}$ and $I_{CN}$ that are received by the current controlled oscillators 202 and 203.

Figure 8:
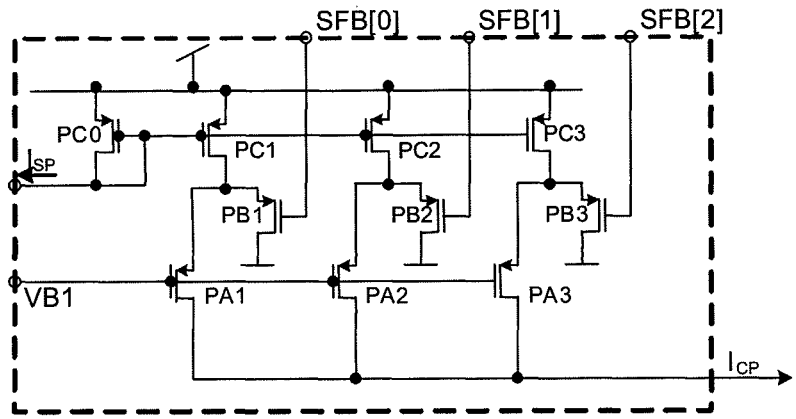
FIG. 8 illustrates an example of a current multiplier suitable for use in embodiments of the present invention.

FIG. 8 illustrates one example of a suitable multiplier that could be used as multiplier 603 (or 604), in this instance a multiplying DAC. The output current, e.g. $I_{CP}$, of the multiplier is the sum of currents passing though three output PMOS transistors: PA1, PA2 and PA3, which are each supplied with a suitable bias voltage VB1. The gate voltage of transistor PB1 is driven by one bit SFB[0] of the digital regulation signal SFB. When the relevant bit of the regulation signal SFB[0] is lower than the bias voltage VB1 (say at ground), no current passes through PA1, and all the current through PC1 passes through PB1. If, however, bit SFB[0] is higher than the bias voltage VB1, then no current passes through PB1, and all the current through PC1 passes through output transistor PA1. The current through PC1 is defined by a current mirror arrangement via PC0 driven from the converted input signal $I_{SP}$ (or alternatively $I_{SN}$).

Likewise the current through output transistors PA2 and PA3 is controlled by the relevant state of bits SFB[1] and SFB[2] compared to the bias voltage. In this way the total output current $I_{CP}$ is the weighted sum, according to the regulation signal SFB, of currents proportional to ISP. Obviously the multiplier shown in FIG. 8 is suitable for a three bit input regulation signal but the circuitry could have two bit input regulation signals or be extended to cope with regulation signals with a greater number of bits.

It should be noted that transistors PC1, PC2, etc. may be equal sized and thus give equal or binary weighted currents. Alternatively, the transistors PC1, PC2, etc. may be unequal in size, for example they may be binary weighted according to the format of SFB and thus give binary weighted currents.

Figure 9:
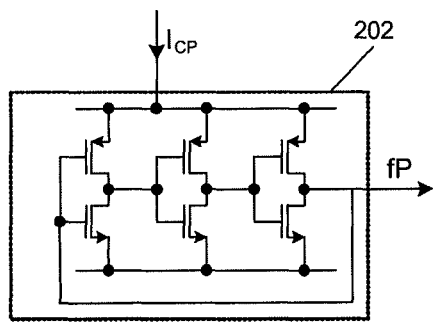
FIG. 9 illustrates an example of a current controlled oscillator suitable for use in embodiments of the present invention.

The resulting scaled current control signal $I_{CP}$ is then passed to the relevant current controlled oscillator. FIG. 9 illustrates a suitable current controlled oscillator 202 comprising a chain of a plurality of CMOS inverters, in this example three but of course other numbers and/or types of oscillator can be used, whose oscillation frequency fP (or fN) is controlled according to the magnitude of the control current $I_{CP}$ (or $I_{CN}$).

Figure 10:
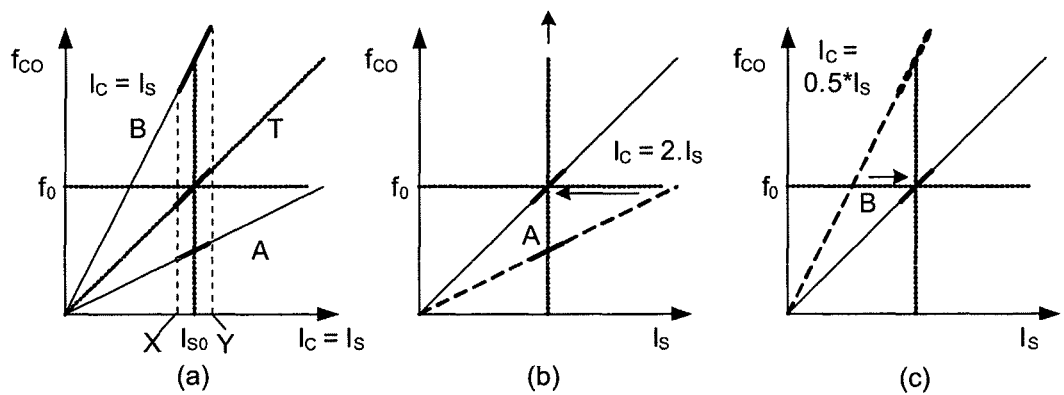
FIG. 10 illustrates the principles of calibration using current scaling.

By scaling the control current variations in the transfer characteristic can be calibrated for, as illustrated in FIG. 10. FIG. 10 illustrates the relationship between the control current, $I_C$, and the frequency of the controlled oscillator $f_{CO}$. FIG. 10*a* illustrates a situation before any calibration correction is applied, for example the value of regulation signal SFB may be set to 1 such that the control current $I_C$ is equal to the signal current $I_S$ output from the voltage-to-current converter.

Curve T illustrates a desired nominal characteristic and curves A and B illustrate two examples of different frequency/current relationships that may occur, for example due to manufacturing and/or environmental variations. It can be seen that for a given input signal which produces signal currents $I_{CP}$ and $I_{CN}$ (illustrated by the dotted lines X & Y respectively), the nominal characteristic T would result in a certain frequency differential and hence a certain value of Dout. However if the oscillator were operating with the frequency-current relationship illustrated by curve A the resulting frequency differential, and hence value of Dout, would be lower than the nominal value. Likewise were the oscillator operating with the frequency-current relationship illustrated by curve B the resulting frequency differential, and hence value of Dout, would be higher than the nominal value.

It can also be seen from FIG. 10*a* that the centre frequency of the oscillator also varies as the oscillator transfer characteristics change.

As explained previously the value of Cout which is the sum of the number of pulses in the first and second pulse streams is proportional to the actual centre frequency, $f_0$, given the actual operating characteristics. By comparing this to the desired value of $f_0$ an appropriate scaling factor can be determined. Thus for example curve A in FIG. 10*a* shows a characteristic where the oscillator is delivering only half the desired frequency at the zero differential input signal level (which corresponds to a signal current $I_{S0}$). FIG. 10*b* illustrates that by multiplying the signal current by a factor of 2 the resulting control current produces the desired frequency relationship. Likewise curve B in FIG. 10*a* shows a characteristic where the oscillator is delivering twice the desired frequency at signal current $I_{S0}$. FIG. 10*c* illustrates that by multiplying the signal current by a factor of 0.5 the resulting control current produces the desired frequency relationship.

Note that these curves assume that the actual transfer characteristic of control current to frequency is linear in the operating range of the oscillator and that the curves can be extrapolated to pass through the origin. This is a reasonable assumption and in many cases the variation in transfer characteristic from the nominal characteristic may exhibit this kind of behaviour. It will be appreciated that the known origin may not correspond to zero or negligible to a first order, for instance there may be some sort of known pedestal current which can be accounted for in the logic 502, i.e. LUT.

Figure 11:
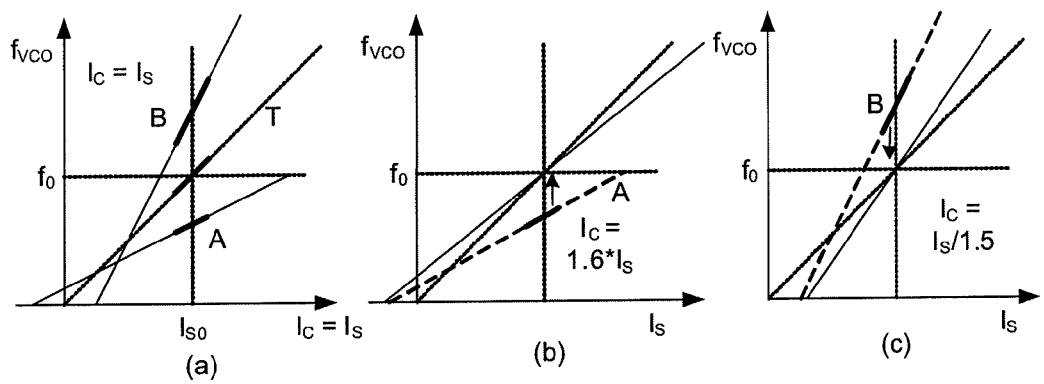
FIG. 11 illustrates calibration where the current-voltage characteristic do not share a common origin.

In some instances however a frequency-current relationship may occur that does not (pre-calibration) share a common origin with the desired characteristic or indeed with a different frequency-current relationship that may occur at a different time under different environmental conditions. FIG. 11 illustrates such a situation where a deviation in the extrapolated zero-frequency control current exists in the various operating characteristics, for example because of some tolerance in the pedestal current required or supplied. FIG. 11a illustrates a desired nominal characteristic T and curves A and B again represent variations in the characteristic which could be experienced. FIGS. 11b and 11c represent the resulting characteristics after scaling the currents to fix the centre frequency $f_0$ to its nominal value for curves A and B respectively. Whilst this scaling ensures that the value of $f_0$ is correct there may be an error in the gradient of the frequency-current relationship compared to the desired nominal value which could lead to an error in the value of Dout.

In some instances the resulting error in the gradient may be small and can be tolerated. However if more accuracy is required it may be necessary to perform a two-point calibration process. This requires a known signal level or signal current to be supplied and the resulting oscillator frequency or frequency difference determined, for example by looking at the count value of one of the counters arranged to count the pulses of the first or second pulse streams or the first digital signal Dout.

Figure 12:
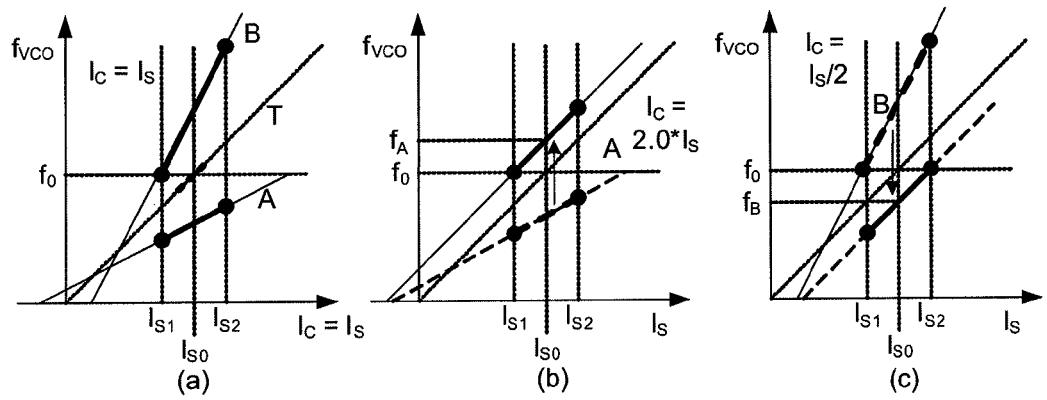
FIG. 12 illustrates two-point calibration with current scaling.

For example if a known non-zero differential signal is applied, i.e. the input signal current for each oscillator is not equal to $I_{S0}$, the value Dout can be used to determine the difference in frequency between $I_{SP}$ and $I_{SN}$ and hence the actual gradient of the current-frequency relationship. The value Dout for the known input signal can therefore be compared to the desired value and the result used to scale the control current as shown in FIG. 12. FIG. 12a shows the same nominal characteristic T and possible operating characteristics A and B as shown in FIG. 11a but with a differential signal applied leading to control currents $I_{S1}$ and $I_{S2}$. The first digital signal Dout is then used to determine the gradient of the frequency/current characteristic and hence an appropriate scaling factor. FIGS. 12(b) and 12(c) show the result after the scaling is applied. It can be seen that in this arrangement the control current is a scaled version of the signal current, which results in the gradient being corrected. Hence a given value of input signal will lead to a desired digital output value.

Scaling the current in this way based on the value of Dout doesn't correct the value of the centre frequency $f_0$ and thus the actual frequency of operation at a zero-differential input signal may vary from the desired nominal value. In many instances this may not be a problem but in some applications the counters may be designed with a nominal $f_0$ in mind and/or other aspects of the ADC may rely on a nominal $f_0$ value. The value of Cout can however be used to correct for any error in $f_0$. Thus in some embodiments the control current may be scaled based on the value of Dout to provide a desired gradient and then a current may be added or subtracted (as will be described later) based on the value of Cout (adjusted for the scaling applied), in order to provide a correction for $f_0$.

Note that the discussion above about two-point calibration has discussed calibration being performed using the pulse streams from both oscillators. If a known signal level is applied to one of the oscillators it would, of course, be possible to calibrate that oscillator independently by looking at the count value from the appropriate counter. For a two point calibration process this would then require two different input control currents (one of which may be equal to $I_{S0}$) to be applied to that oscillator at different times.

It will also be noted that if the calibration is performed by supplying a known signal level then it may not be necessary to determine Cout from the sum of the two counters. Instead an input signal corresponding to a zero-level differential input could be supplied, i.e. a control current equal to $I_{S0}$, and the value of the count of the relevant counter used directly as a value proportional to $f_0$.

The use of Cout does mean though that, for a one point calibration such as described with reference to FIG. 10, there is no need to supply any known signals at all. As will be described later such a method is therefore suitable for calibration in use without interrupting normal operation. Even when applying the two-point process as described with reference to FIG. 12 it is only required to supply one known non-zero signal in order to determine sufficient information to allow correction of the gradient and/or the $f_0$ value of the transfer characteristic, as Dout allows correction of the gradient and Cout allow correction of the centre frequency. Clearly having to supply only one known signal level will ease implementation and reduce the time required for calibration.

As mentioned above, in some applications it may be adequate to calibrate the centre frequency, $f_0$, only on start-up, or at least on some system reset/re-calibrate control signal. Such an initial calibration may be suitable in applications where most of any variation to be cancelled arises from manufacturing tolerances rather than environmental variables such as temperature or supply voltage. However in other applications, where more accuracy is required or where environmental conditions are more variable, the regulation circuitry could be configured to apply continuous (or at least regular) calibration.

The embodiment discussed above with reference to FIG. 2 is suitable for continuous calibration, although some additional elements may be used in the feedback path to cope with the complex demands of continuous feedback.

Figure 13:
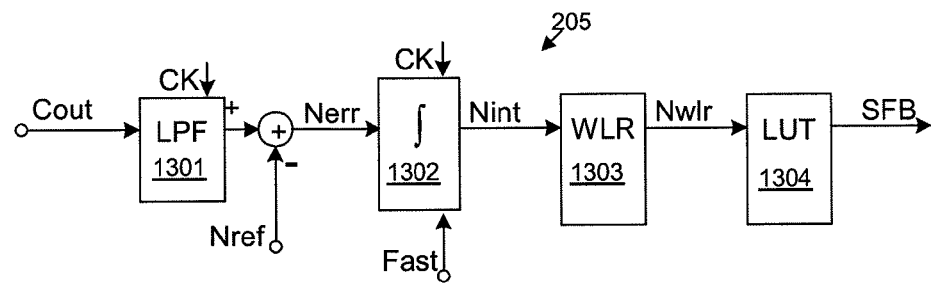
FIG. 13 illustrates another example of comparison/feedback circuitry suitable for use in embodiments of the present invention.

FIG. 13 shows one embodiment of regulation circuitry 205 which may be used for continuous calibration. The digital value Cout may be filtered by low-pass filter 1301 to reduce sample-by-sample variations, for example caused by any asynchronism of the system or thermal noise. It should be noted that that Cout may exhibit some signal-dependent modulation due to non-linearities in the transfer characteristic of the oscillators $K_{VCO}$ characteristics or other such imperfections. Any such modulations will be small and thus the value Cout can still be considered signal independent, as it is substantially independent of the input signal.

This low-pass filtering may also yield a digital signal with more bits. This smoothed signal is then subtracted from the desired value Nref corresponding to the desired centre frequency $f_0$ to produce an error signal Nerr. In other embodiments however the low-pass filter 1301 may be arranged after the subtraction (which may require wider input/processing at input to LPF but allow a possibly narrower subtractor).

The Nerr signal may be further processed before being used to modulate the ADC operation, for example being applied as regulation signal SFB to the multipliers 603 or 604 of FIG. 6.

For example an integrator 1302 may integrate the error signal Nerr to increase the gain of the loop and thus increase accuracy while not allowing high frequency components to modulate the ADC transfer function. In some embodiments therefore the integrator 1302 is used instead of, or in addition to, the low-pass filer 1301.

The Nerr signal, or the integrated version Nint may be mapped by some function, for example by a look-up table (LUT) 1304. The LUT 1304 may implement at least a first-order correction for anticipated non-linearities in the current/frequency transfer function and/or implement soft clipping to help transient mitigate overload and/or start-up issues.

The control circuitry receiving the regulation signal and/or look-up table 1304 may have only a relatively small number of elements, but the signal processing described above may deliver a high-word-length result. A word-length reduction block 1303 may therefore be used to reduce the word length, using any of a range of known techniques, without introducing extra quantisation noise in frequency bands of interest.

In some embodiments the regulation signal may be passed to the control circuitry, e.g. the multiplying DAC of FIG. 8, via a multi-tap delay line to add a stage of filtering. In other words the inputs SFB[0]– to SFB[3] could receive successively delayed versions of a bit to provide a single bit delay line. A multi-bit delay line could also be implemented, with taps connected to correspondingly scaled current sources.

For continuous calibration the loop bandwidth may, in some applications such as use in audio systems, be relatively low, for example less than 1 Hz, to avoid artifacts in the frequency band of interest. However on start-up rapid settling to nominal operational conditions may be required. The bandwidth, for example of the filter or integrator (whatever sets the dominant poles in the response) may therefore be temporarily increased during start-up to give quicker settling, for example by asserting a control signal Fast. Other techniques such as binary search or interpolation may also be used to speed up initial settling. In other words following start-up of the ADC the regulation circuitry may initially operate in a first mode which provides rapid settling to a stable regulation signal before transitioning to a second mode which would provide a slower settling response than the first mode, but possibly a better accuracy. The ADC may operate in the first mode for a certain period of time following start-up and/or until a certain error threshold is reached before transitioning to the second mode. In the second mode the loop bandwidth of the regulation circuitry may be lower than in the first mode.

FIGS. 2 and 3 above were discussed on the basis that the counters 301 and 302 are reset each sample period based on clock signal CK. Thus the value of Cout determined each sample period will be substantially constant for a given set of operating conditions. As mentioned previously however in some instances an ADC may be arranged as an integrating ADC. In an integrating ADC the counters are not reset and thus the individual count values DP and DN of the number of pulses of the first and second pulse streams continually increase. Consequently the value, Cout, of the sum of these count values will also continually increase.

Figure 14:
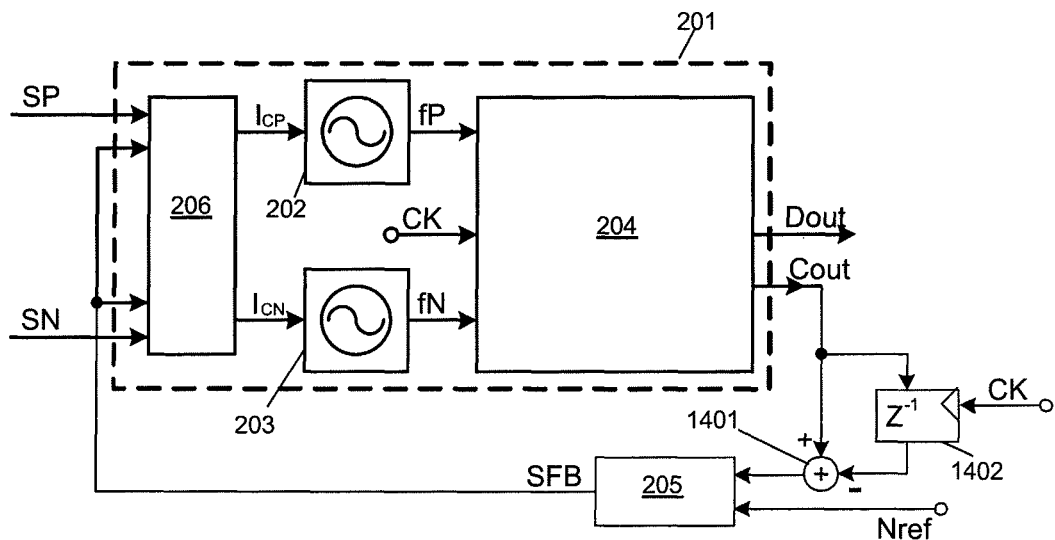
FIG. 14 illustrates an embodiment of the invention implemented as an integrating ADC.

FIG. 14 illustrates an embodiment of an integrating ADC that is similar to that shown in FIG. 2 and wherein similar components are identified by the same numerals. In the embodiment shown in FIG. 14 the value Cout is differentiated by subtracting 1401 the present value of Cout from the previous value received from a delay block 1402. The resulting value is compared with Nref in the circuitry 205 as described previously.

Figure 15:
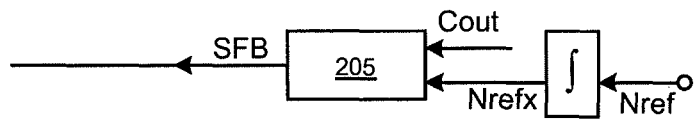
FIG. 15 illustrates comparison circuitry which uses an integrated value of a reference count value.

Alternatively the integrated Cout count may be used and compared to an Nref signal which is generated by continually integrating a single value of Nref as shown in FIG. 15.

Figure 16:
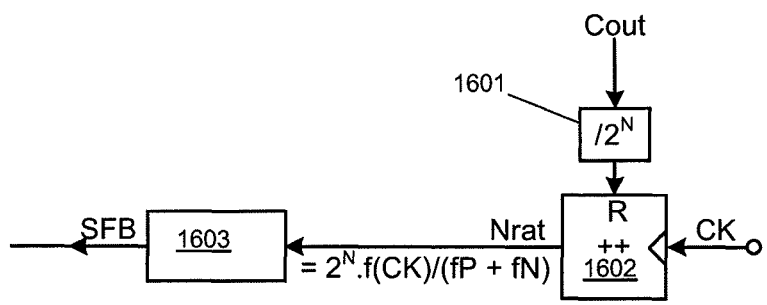
FIG. 16 illustrates regulation circuitry that generates a signal inversely proportional to the number of pulses of the first and second pulse steams.

In another embodiment, as shown in FIG. 16 a value directly inversely proportional to Cout may be generated. The integrated value of Cout is received at a $2^N$ counter/buffer 1601 such that each time Cout ramps up past $2^N$, a feedback counter 1602 is sampled and reset. The counter 1602 increments based on a clock signal CK at a frequency f(CK). The output of counter 1602, Nrat, is therefore number of CK cycles taken for Cout to ramp through $2^N$ and is equal to $2^N \cdot f(CK)/(fP+fN)$.

For an example of the principle of operation, consider that the initial regulation signal SFB is set to unity, e.g. by logic 1603. The value of Cout increases at a rate equal to $2 \cdot f_0$ as described previously. Therefore, if the value of $f_0$ is equal to $2^{N-1} \cdot f(CK)$, then the output of the counter Nrat will be unity. If this Nrat is used as a revised regulation signal SFB, then $f_0$ will settle to this value. If however the initial value of $f_0$ is half this value, then Cout will take twice as long to ramp past $2^N$ thus allowing twice as long for the counter to increment before being sampled and reset. Thus the output Nrat will be 2. If this value is used as a revised value for the regulation signal SFB, and if the oscillator frequency is proportional to SFB, the oscillator frequency will be doubled. Thus this circuit may be used as a simple one-shot calibration. For better accuracy, Nrat may be averaged over several feedback counter resets, or equivalently N may be increased and SFB scaled appropriately. If the desired centre frequency $f_0$ is some other value than $2^{N-1} \cdot f(CK)$ then again Nrat or SFB may be appropriately scaled.

Alternatively, Nrat may be compared against some target value and the error integrated inside the feedback block as described above.

Of course it will be appreciated that if calibration is only preformed on start-up then during the initial calibration period the ADC may be arranged as a non-integrating ADC and calibrated as described previously.

The previous discussion has generated the value Cout by summing the counts of the number of pulses of the first and second pulse streams. However there are other ways of generating a suitable signal-independent value representative of the centre frequency $f_0$. For example it will be clear from equations 4 and 7 or 8 above that a value equal to Cout could be obtained by taking the count value DP (or DN) and adding (or subtracting) half the output value of the first digital signal Dout. Half the output value Dout could be obtained by a simple bit shift.

Figure 17:
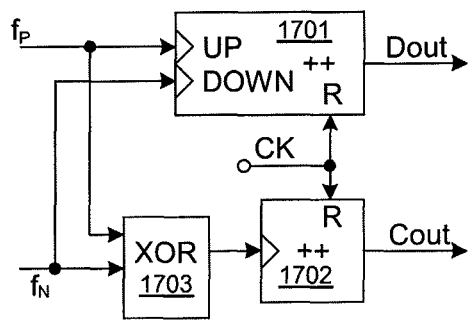
FIG. 17 illustrates an alternative embodiment of difference circuitry suitable for use in embodiments of the present invention.

FIG. 17 shows an alternative arrangement for generating Dout and Cout. An up/down counter 1701 receives the first and second pulse streams. Each pulse of the first pulse stream, fP, increments Dout, each pulse of the second pulse stream, fN, decrements the counter 1701, which may be sampled and reset each clock period to provide Dout. Each pulse on either pulse stream, fP or fN, will also toggle the output state of the XOR gate 1703, and every alternate such toggle will increment the counter. The input to the XOR gate 1703 and/or the counter 1701 may have some signal conditioning circuitry to cope with simultaneous or near-simultaneous fP and fN edges.

In some applications however, if the difference signal will typically average to zero and an ADC response down to d.c. is not required, it may be sufficient to take the output from one of the counters for one of the pulse streams and apply heavy filtering to remove any signal band component. The resultant filtered value may be taken to be indicative of the average frequency, which can be assumed to be zero-differential input. However, such conditioning requires more computation than using the (to a first order) signal independent Cout value.

Also, where constant calibration is not required and the input signal is expected to reach zero every so often it may be possible to monitor Dout for any instance where Dout is equal to zero and use this as an indication that SP was equal to SN. The corresponding count value from one of the counters could then be taken as being indicative of the present value of $f_0$. In this way calibration could be performed using input signals of opportunity.

In all of the embodiments discussed above the counters may preferably be multi-bit counters, for instance 5-bit counters. However in some instances the output of each counter could simply be a one-bit signal so as to provide a three level output Dout, e.g. {−1, 0, +1}. Thus, Cout would simply be equal to {0, 1, or 2}. In this case each counter, e.g. counters 301 and/or 302 shown in FIG. 3, could be a D-type flip-flop, whose output represents whether or not there has been an edge of a pulse of the first pulse stream fP (or the second pulse stream fN) within a clock period. Such an arrangement requires a higher-speed clock CK, at least as fast as the maximum oscillator frequency, and the output data streams Dout and Cout are also thus a much higher sample rate giving a high-speed lower-resolution output bit-stream. Such a low-width data stream is attractive in some applications for ease of transmission. If required a two-level bit stream may be generated from the three-level data stream by known purely digital word-length reduction or noise-shaping techniques. This may be an attractive implementation if the circuit is implemented as small geometry silicon integrated circuitry.

Such implementations may also require more digital filtering of the fed-back data stream to allow for the likely higher quantisation noise, but this is not typically a significant issue for small geometry silicon integrated circuitry implementations.

Figure 18:
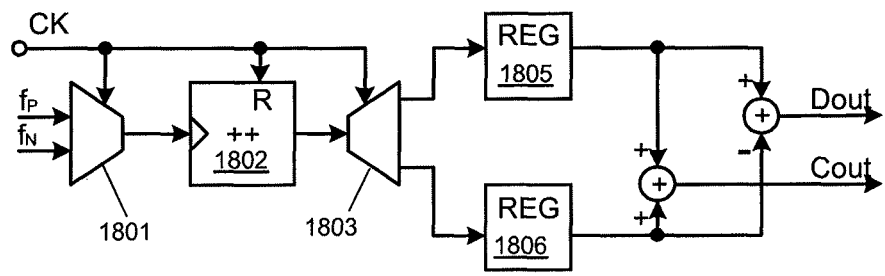
FIG. 18 illustrates a single counter multiplexed between the first and second pulse streams.

In the embodiment shown in FIG. 3 two counters are shown, one for each pulse stream. In some applications however, for example where the signal bandwidth is much lower than the CK frequency, it may be possible to use a single physical counter, as shown in FIG. 18. A multiplexer 1801 multiplexes the two pulse streams between a single counter 1802. The output of the counter 1802 is demultiplexed to respective registers 1803 and 1804. The counter is reset on either edge of CK. The outputs Cout and Dout might be used on every period of CK, or only on alternate cycles.

It may be possible to use a single oscillator multiplexed between SN and SP, especially for very low bandwidth systems. The input signals SN and SP may be multiplexed between a single oscillator which thus alternately outputs the first and second pulse streams. These alternate pulse streams could be input to a single counter as described with reference to FIG. 18.

Referring back to the general ADC arrangement shown in FIG. 2 it was noted previously that the zero-input signal frequency $f_0$ of the oscillators is advantageously significantly faster than clock signal so as to improve counter resolution. The apparent frequency of the oscillator may also be increased by taking multiple taps from the oscillator circuitry as illustrated in FIG. 19.

Figure 19:
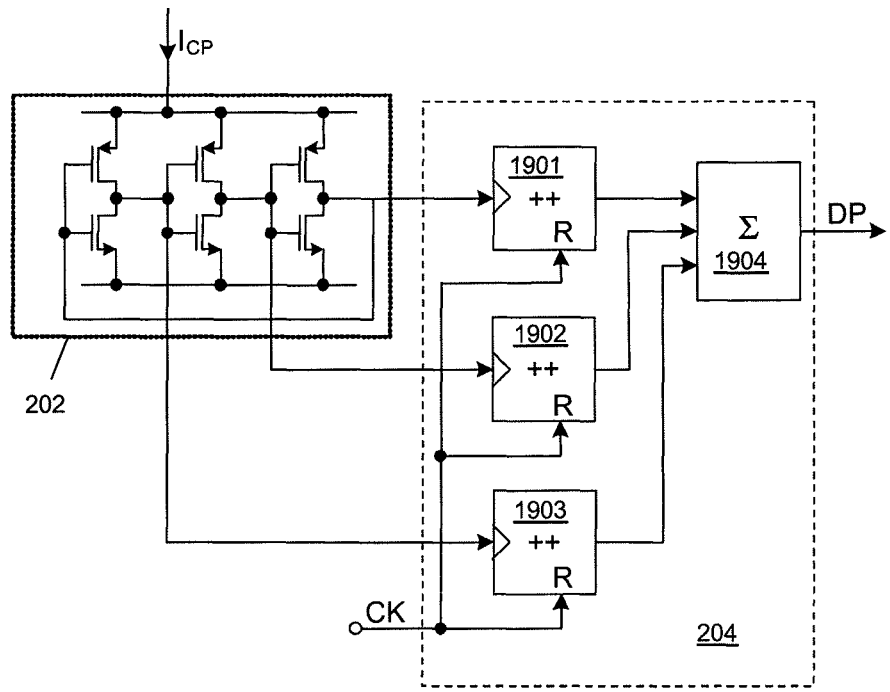
FIG. 19 illustrates a multi-tap oscillator and counter circuitry for increased counter resolution.

FIG. 19 shows an oscillator 202 (or alternatively 203), such as the oscillator shown in FIG. 9 which comprises a chain of CMOS inverters. In this embodiment the counter circuitry 204 receives multiple inputs from the oscillator with the inputs being taken from different tap points. Each input is received by a respective counter 1901-1903 which are sampled and reset together. The output from each of the counters 1901-1903 are summed by adder 1904 and the result output as the count value DP. The first pulse stream can therefore be seen to be the collective pulse streams from all the tap points.

As also mentioned above in some embodiments it may be desired to use the regulation signal to shift the control current, i.e. to add to or subtract from the signal current, to modulate the current-voltage characteristic of the oscillator.

This could be combined with a current scaling step, as described above in relation to FIG. 12, to adjust not only the gradient of the transfer characteristic but also fix the value of $f_0$ to its nominal value.

In some applications however it may be that the main error it is wished to correct for is a shift in the value of the centre frequency $f_0$ away from its nominal value. In other words the gradient of the actual frequency-current relationship of the oscillator may not be significantly different from the desired nominal characteristic but the centre frequency $f_0$ may be shifted as a result of varying pedestal currents or the like. Although this may not result in an error in the difference frequency, it may affect operation of the rest of the ADC. For example were the actual centre frequency to be higher than the desired nominal it is possible that at maximum signal level the number of pulses of one of the pulse streams in a sample period may exceed the capacity of the counters. In this instance therefore it may be desired to reduce the centre frequency to the nominal value.

Figure 20:
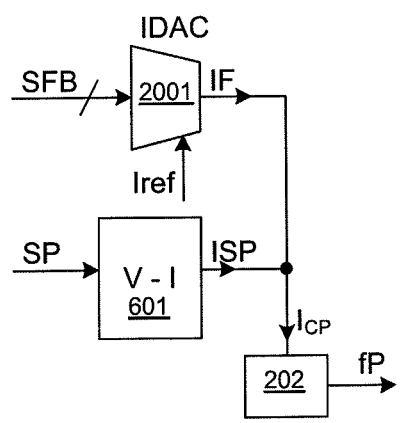
FIG. 20 illustrates an embodiment of control circuitry for additive current modulation.

FIG. 20 illustrates one embodiment of control circuitry for additive current modulation. FIG. 20 illustrates an input signal, e.g. SP, is converted to a signal current $I_{SP}$ by voltage-to-current converter 601 as described previously. The regulation signal SFB in this instance is a signal indicating the amount of current addition required. The regulation signal is received by a current DAC 2001 which receives a reference current Iref and produces a scaled version IF of Iref. This scaled current IF is a modulation current which is then added to the signal current and the combined current IC is input to oscillator 202. The current DAC 2001 may comprise a current DAC as shown in FIG. 8 but receiving the reference current Iref rather than the signal current. Similar circuitry may be provided for the other input signal SN to produce a suitable modulation current, although in some embodiments the same current DAC 2001 may be used for both signal paths with the modulation current IF being duplicated by a current mirror to provide a modulation current.

In the event that both current scaling and current shifting were required, the output from the voltage-to-current converter could be scaled as discussed previously by a first regulation signal and then added to the modulation current IF which is generated based on a second regulation signal.

Figure 21:
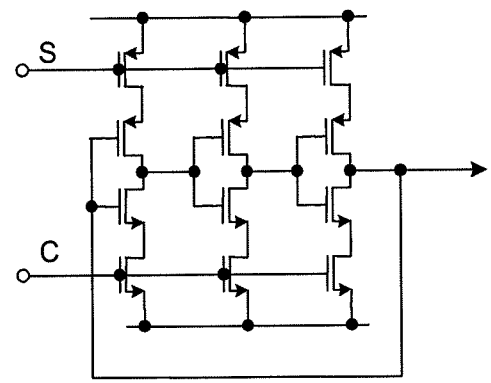
FIG. 21 illustrates a dual input oscillator suitable for use in embodiments of the present invention.

In an alternative embodiment the current controlled oscillator may have dual inputs as shown in FIG. 21. Signal input S could receive the input current signal, e.g. directly from the voltage-to-current converter or scaled appropriately as discussed above and control input C could receive a regulation signal. The result would be effectively additive modulation. In some embodiments the control input C may receive an initial value on start-up (i.e. a default or previously stored value or a value determined from an initial calibration phase), with the input to the signal input being continuously calibrated to apply fine-tuning in operation.

The embodiments described previously have discussed modulating the oscillator properties by modulating the control current(s) supplied to the current controlled oscillator circuitry. In another embodiment however the oscillator properties may be modulated by modulating the control voltages.

Figure 22:
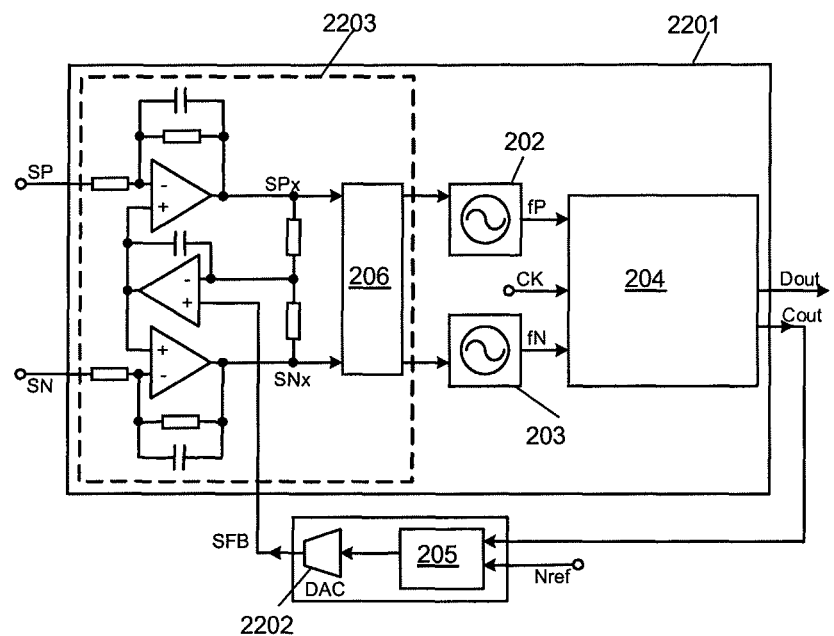
FIG. 22 illustrates an ADC according to embodiment of the invention with control circuitry for common mode voltage modulation.

FIG. 22 illustrates an embodiment for modulating the common mode voltage of the oscillators. Components in FIG. 22 which have the same function as those shown in FIG. 2 are referred to be the same reference numerals. FIG. 22 illustrates an ADC with oscillators 202 and 203 receiving first and second pulse streams as described previously. Circuitry 204 comprises difference circuitry for determining Dout and also regulation circuitry for determining Cout as described previously. The regulation circuitry also comprises circuitry 205 for comparing Cout with the reference count value Nref. In this embodiment however the result of the comparison is converted to a voltage by DAC 2201 to generate the regulation signal SFB.

The control circuitry 2203 uses the analogue regulation signal SFB to modulate the common mode voltage of the input signals SP and SN and thus produce intermediate signal voltages SPx and SNx. These intermediate signal may be received by current control circuitry 206, which in this embodiment may comprise simple voltage-to-current converters for converting to signal currents for controlling the oscillators as described previously.

Figure 23:
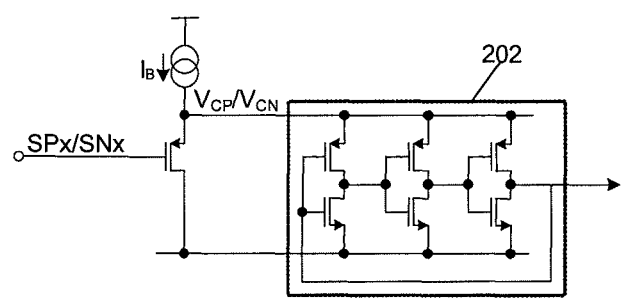
FIG. 23 illustrates direct voltage modulation of a controlled oscillator.

In another arrangement the voltage modulated signals SPx, SNx may be applied directly to respective supply rails $V_{CP}$, $V_{CN}$, of the inverters of the oscillators, or possibly through a source follower, as shown in FIG. 23.

In addition to, or instead of, modulating the operating conditions of the oscillators the regulation signal may be used to modulate operation of the counter circuitry, i.e. the difference circuitry. Where the counter circuitry is sampled and reset each count period defined by a clock signal the modulation may involve modulating the count period, for instance by modulating the frequency of the clock signal.

It will be understood that modulating the count period thus modulates the period during which the number of pulses of the first and second pulse stream are counted. This scales the output of the counters. It will be understood that this does not affect the variation of the oscillator transfer characteristic, i.e. any variation in the oscillator centre frequency, merely compensates the counter outputs for such variation.

For example, if the determined value of Cout indicates that the centre frequency $f_0$ is double the desired value, then the frequency of the clock signal CK can also be doubled. Thus the value of DP and DN and Cout for a zero differential level input signal will match the desired value. Assuming (or approximating) that the transfer function $K_{VCO}$ scales with $f_{VCO}$, the scale factor from SP−SN to Dout will also still be maintained.

Figure 24:
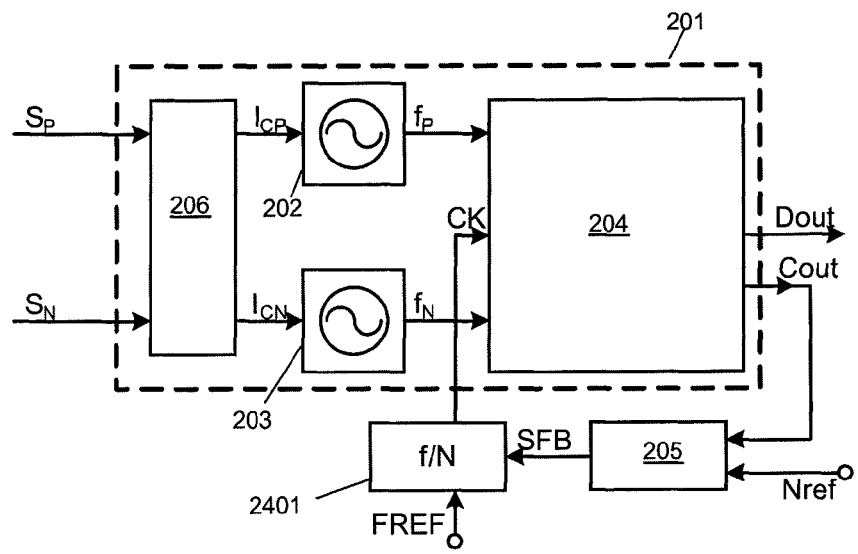
FIG. 24 illustrates an ADC according to embodiment of the invention with regulation circuitry for modulating the count period.

FIG. 24 shows one embodiment for implementing modulation of the clock frequency. In this embodiment the counter circuitry 204 receives the first and second pulse streams as discussed previously and produces values of Dout and Cout each count period, defined by the clock signal CK. The difference circuitry may take the form as shown in FIG. 3 or 17 for example. The value Cout is compared to a reference value Nref as described previously to generate a regulation signal SFB. This regulation signal is received by a frequency modulator 2401, for example a frequency divider, which modulates a frequency reference signal FREF to generate the clock signal CK used by the counter circuitry 204. As mentioned this effectively scales the counter output which thus will address variations in transfer characteristic away from the nominal such as described with reference to FIG. 10.

The calibration may be single-shot, iterative, or continuous as discussed above. The feedback path may contain low-pass filters or integrators as discussed above. The frequency modulator may take any of a number of suitable forms. If a high enough frequency (e.g. 98 MHz for ~3 MHz nominal CK) master clock is available, it may be a simple integer frequency divider. Alternatively a frequency synthesiser or frequency generator could be implemented using FLL, DLL or PLL techniques, or all-digital synthesis techniques.

The embodiment shown in FIG. 10 illustrates modulation of the clock frequency as the only feedback correction. It would of course be possible to combine modulation of the clock frequency with the previously discussed aspect. For example part of a variation in oscillator characteristics is accommodated by variation of the clock signal CK and part by altering the operational conditions of the oscillator as described previously.

Additionally or alternatively a regulation signal may be used to modulate the first digital signal. In other words the difference circuitry may generate the first digital signal based on the difference in number of pulses of the first and second pulse streams and the regulation circuitry may modulate the first digital signal to provide a digital output signal (which may be output from the ADC or in some embodiments be subject to further processing before being output from the ADC). The regulation circuitry may be configured to scale the first digital signal based on the regulation signal, which as described previous may be based on the number of pulses or the first and/or second pulse streams, in particular the sum and/or average of the number of pulses in the first and second pulse streams.

Figure 25:
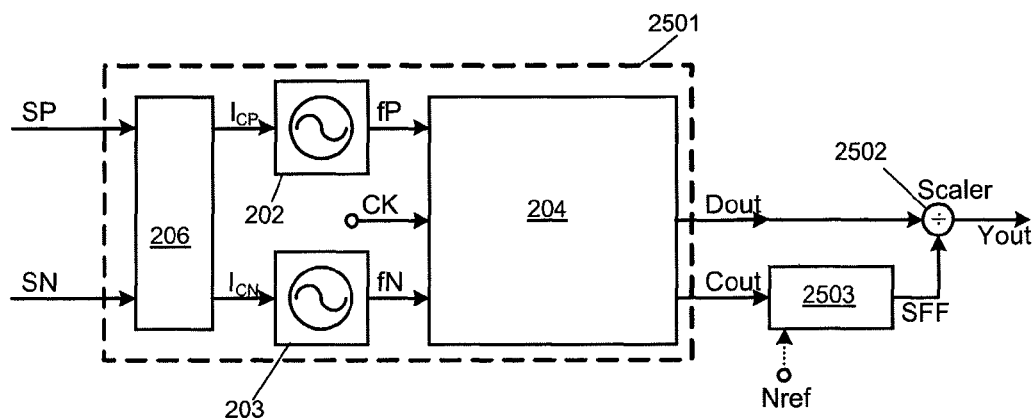
FIG. 25 illustrates an ADC according to embodiment of the invention with regulation circuitry for scaling the output signal.

FIG. 25 illustrates an embodiment of the invention with post-correction for any variation in oscillator transfer characteristic. FIG. 25 shows an arrangement similar to FIG. 2 but in this instance the value Cout is received from counter circuitry 204 and used to generate a feedforward regulation signal SFF that is received by a scaler 2502 to scale the first digital signal Dout to produce a digital output signal Yout. The regulation circuitry thus comprises scaler 2502 for scaling the difference frequency signal Dout according to a factor SFF derived from the signal-independent signal Cout. Conveniently the scaling factor of regulation signal SFF is adjusted such that the system digital output signal Yout (which equals Dout/SFF) represents the fractional change in frequency, i.e. $(fP-fN)/f_0$.

The scaling factor may be determined by comparing Cout to a reference value Nref as described previously. The regulation circuitry may therefore comprise circuitry 2503 which operates in the same manner as discussed previously in relation to FIG. 5 or 13.

However in some embodiments the scaling factor required may be derived directly from Cout without the need for comparison with the reference. From FIG. 10 it will be appreciated that the transfer characteristic A has a gradient which is half that of the desired nominal characteristic. This scaling will affect both the observed centre frequency and the first digital signal Dout by the same factor. Thus if the first digital signal Dout is scaled by a factor inversely proportional to Cout then any scale error in Cout will cancel the same scale error in Dout.

The scaler may be a multiplier or a divider If the scaler is a multiplier the feedforward signal SFF should be inversely proportional to Cout as discussed above, and thus circuitry 2503 may generate a regulation signal SFF which is inversely proportional to Cout.

If the scaler is a divider the value of Cout may be used directly by the scaler 2502 possibly via some averaging or low-pass filtering circuitry 2503.

Figure 26:
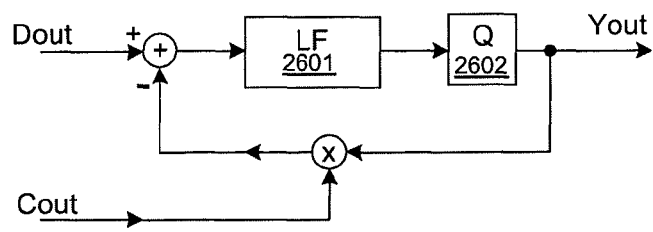
FIG. 26 illustrates a combined divider and remodulator suitable for scaling the output signal.

In one embodiment the scaler 2502 may include some remodulation functionality to scale the first digital signal Dout and remodulate to a desired output signal Yout in a desired format, e.g. reduced bit-width. FIG. 26 illustrates an example of such a scaler. The first digital signal Dout is received by a loop filter 2601, which may be a simple integrator or which may implement a more complex filtering function. The output of the loop filter 2601 is quantised by quantiser 2602. The output Yout may therefore be a low-word-length oversampled stream.

The feedback loop from the output of the quantiser 2602 is modulated by the signal Cout such that, over time, the feedback forces the low-frequency components of the product Yout*Cout to equal those of Dout, in other words this forces Yout=Dout/Cout, despite the quantisation noise introduced by quantiser 2602, which is pushed to higher frequencies.

Figure 27A:
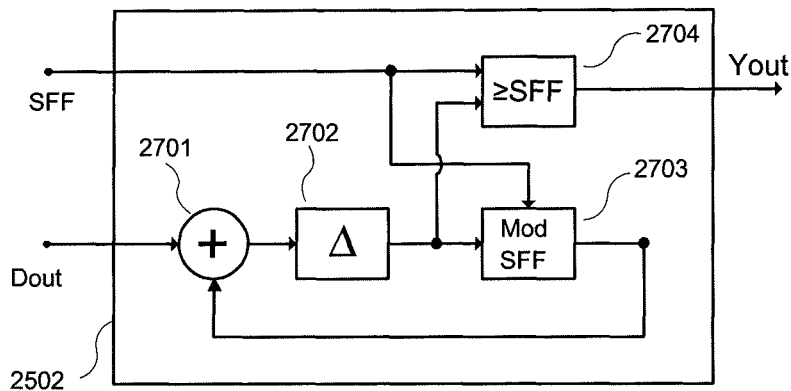
FIGS. 27a and 27b illustrate examples of delta-sigma dividers suitable for scaling the output signal.

Examples of suitable dividers for use as the scaler 2502 are illustrated in FIG. 27. FIG. 27a illustrates one embodiment of a first order delta sigma modulator for use as the divider. The delta-sigma modulator comprises an adder 2701, which receives the first digital signal Dout, and a memory element 2702, coupled to the output of the adder 2701 to maintain an accumulated count. The output of the memory element 2702 is coupled to a modulus element 2703 and a comparison element 2704. The regulation signal value SFF is also provided to the modulus element 2703 and the comparison element 2704.

In operation the adder 2701 adds the value Dout to the accumulated count until the comparison unit 2704 determines that the accumulated count maintained in the memory element is greater than or equal to the regulation signal SFF. At this point an output pulse is produced and the counter is reset by the modulus element 2703. That is, the modulus element 2703 performs a modulus operation on its inputs, subtracting the SFF value from the count value received from the memory element 2702, repeatedly if necessary, until the result is less than SFF.

The average value of the pulse density output from the delta-sigma modulator is therefore exactly equal to Dout/SFF. It should be noted that any value can be used as SFF and it need not have a value equal to $2^N$. The ability to use a value of SFF that is not of the form $2^N$ allows a much wider range of frequencies to be synthesised exactly, rather than with a ratio rounded to a certain number of binary places.

FIG. 27a illustrates a first order delta sigma modulator but higher order modulators could be used if desired. A higher order modulator contains at least two delta sigma modulation stages and a recombination stage at the outputs of the stages to combine the outputs to produce a pulse density modulated output. In such an embodiment the output of the modulus element 2703 may also be provided from one stage to the next as an error value.

Figure 27B:
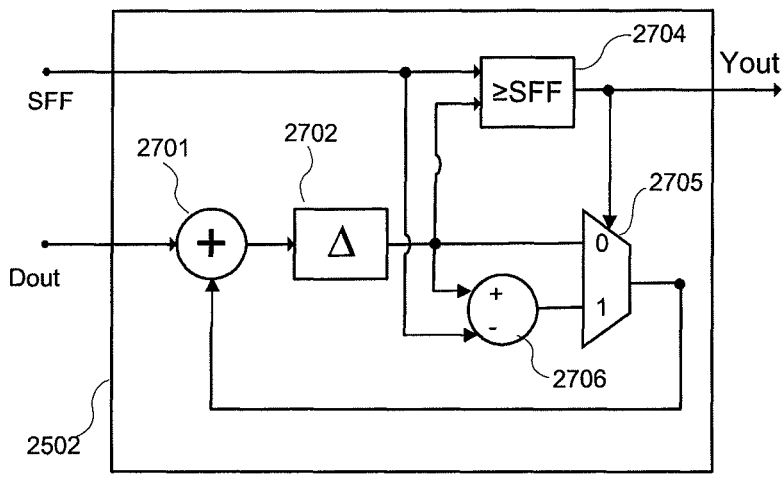

Modulus operations are typically computationally expensive and thus in an alternative delta sigma modulator, as shown in FIG. 27b the modulus unit 2703 is simplified to a multiplexer 2705 and a subtractor 2706. The accumulated count of Dout may be inputted to the multiplexer 2705, along with the accumulated count minus the value SFF from subtractor 2706. The multiplexer selects an output from one of these inputs depending on whether the comparison element determines that the accumulated count is greater than or equal to SFF. If the comparison element determines that the accumulated count is greater than or equal to SFF, an output pulse is generated, which is also passed to the multiplexer to select the output with the accumulated count minus SFF for feed back to the adder.

However the feedforward signal SFF is generated and used to scale the output it will be appreciated that, like the embodiments using a feedback regulation signal, the regulation signal may be generated on start-up, or may continuously correct during operation, in which case Cout may also be low-pass filtered or otherwise conditioned to remove ripple or quantisation noise from various sources.

In some embodiments the regulation circuitry may generate both a feedback regulation signal SFB and a feedforward regulation signal SFF.

Figure 28:
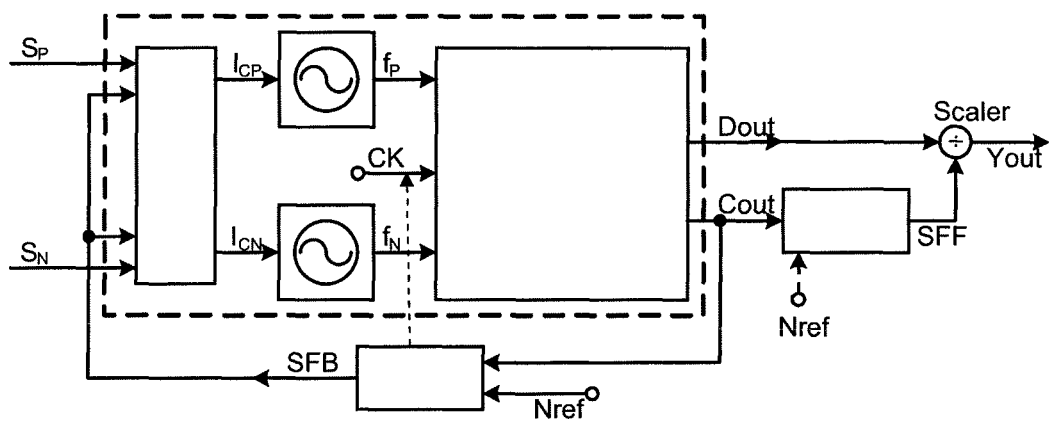
FIG. 28 illustrates an ADC according to embodiment of the invention with regulation circuitry for scaling the output signal and modulating the operating conditions of the oscillation circuitry.

FIG. 28 illustrates an embodiment where a feedforward regulation signal SFF is generated to scale the first digital signal Dout and a feedback regulation signal SFB is also generated, in this instance to modulate the operating conditions of the oscillators but a feedback signal for modulating the clock signal for the counter circuitry may additionally or alternatively be generated. Clearly the feedback and feedforward regulations signals will be generated bearing in mind the overall correction applied. The different loops may have different loop bandwidths to avoid interaction and/or one path, say the feedback path, may used on start up and the other path used for later continuous fine adjustment.

The embodiments of the present invention described above thus allow control over the gain of the ADC, for example to provide for calibration or correction of any variations in operating characteristics of the oscillators from a nominal or previous characteristic.

Additionally or alternatively regulation circuitry may be provided for modulating the operation of the ADC in response to an indication of the amplitude of at least one of the first and second input signals.

For large signals input signals the ADC will eventually overload. If the ADC has voltage-to-current converters these converters may saturate, or the VCO gain characteristic may start to go unacceptably non-linear or saturate. In some instances the count may increase past the capacity of the counter.

Rather than simply let the signal clip in some instances it may be advantageous to be able to temporarily reduce the gain of a VCO ADC. This may allow the ADC to cope with overload signals, e.g. temporary loud sounds, without just clipping and thus losing signal information. This may for instance apply when trying to retain at least some speech information from a microphone during a sudden burst of incident wind or pressure pulse from a door slam.

One option is to modulate $K_{VCO}$ by use of a regulation signal to modulate the operating parameters of the oscillators to avoid saturation or non-linearity. The principle of modulating the operation of the oscillators applies in the same way as described above but the regulation signal is based, at least partly, on the input signal.

Figure 29:
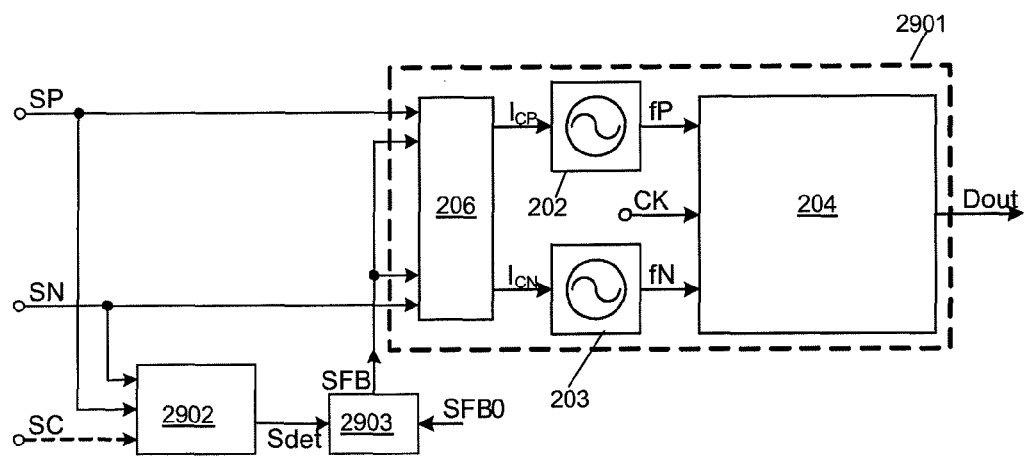
FIG. 29 illustrates an ADC according to embodiment of the invention with regulation circuitry for modulating the operating conditions of the oscillation circuitry based on an indication of input signal amplitude.

FIG. 29 illustrates an embodiment of an ADC 2901 which modulates the operating conditions of the oscillators in response to an indication of the amplitude of the input signal. A signal amplitude module 2902 receives an indication of the amplitude of the differential input signal, or at least one of the individual input signals SP/SN. This could be an indication of peak amplitude or envelope of the signal or the r.m.s. signal level. The signal amplitude module may comprise a detector which detects the signal level of the input signal(s) itself, for instance an envelope/peak detector with fast attack time and slow decay time, or it may be arranged to receive an indication of detected or expected signal amplitude from upstream circuitry, for example in an audio application it may be based on a volume setting or analogue-domain gain, received as a control signal SC.

The amplitude module 2902 generates a level detect signal which varies with indication of amplitude of the input signal. The level detect signal may vary substantially continuously with amplitude, at least for a first range of amplitudes and/or may change stepwise based on comparison with one or more thresholds. The amplitude detect module may for instance compare the input amplitude with one or more threshold levels and output an appropriate signal based on the comparison. The level detect signal is received by regulation circuitry 2903 which may also receive a default feedback signal SFB0. The default feedback signal level may be a predetermined default value, for instance set in the design of the IC, or as part of a factory calibration, or may be a result of some initial calibration. The regulation circuitry then generates a regulation signal SFB for modulating the operation of the oscillators in a similar manner as described previously. In the event that a large amplitude input signal is detected the feedback signal may operate to effectively reduce the gradient of the transfer function to prevent the oscillator from saturating or becoming non-linear. For example when using current controlled oscillators the scaling of signal current to control current may be reduced to reduce the actual control currents delivered to the oscillators in the event of a large amplitude signal.

This embodiment therefore has overload regulation and is able to provide some signal information in the event of large amplitude signals that otherwise may cause clipping. The overload regulation may be combined with calibration regulation so as to ordinarily compensate for unwanted variations in transfer characteristic of the VCO but to deliberately modulate the ADC operation to avoid or at least mitigate overload.

Figure 30:
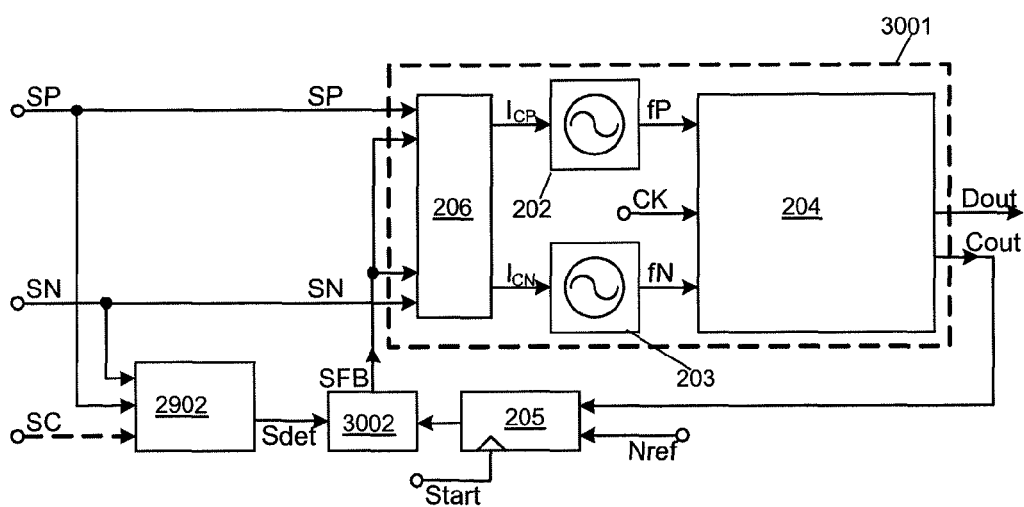
FIG. 30 illustrates an ADC according to embodiment of the invention with regulation circuitry for modulating the operating conditions of the oscillation circuitry based on an indication of input signal amplitude and also the number of pulses of the first and second pulse streams.

FIG. 30 illustrates an embodiment of an ADC 3001 with both regulation for error correction and for overload control. In this embodiment the Cout value produced by counter circuitry 204 may be compared to a reference value Nref as described previously to generate a calibration signal. Also amplitude module 2902 receives an indication of the input signal amplitude and outputs a level detect signal Sdet. Scaler 3002 receives the calibration signal and level detect signal to produce a regulation signal SFB which, at normal signal levels calibrates for any variation in transfer characteristic, but which at high signal levels is scaled to reduce the control currents delivered to the oscillators.

The scaling factor may be one level, several levels, or indeed an essentially smooth non-linear mapping via look up table or other means.

Modulating the operating conditions of the ADC in this way for high amplitude signals will, of course, have an effect on Dout for such signals. In some embodiments therefore a further scaling may be applied downstream of the oscillators to reverse the effect of the signal level induced modulation.

In one embodiment the scaling factor may also be applied to the clock signal CK used to clock the counters. In other words if, in the event of a large amplitude signal if a scaling factor of say a half is applied to the signal currents (so that the resulting control currents are a half of what they otherwise would have been), then the frequency of the clock may also be halved, so as to double the count period. This means the count value produced is the same as that that would have been produced were no scaling applied to the large amplitude input signal.

This would require the counters to have sufficient bits to cope with large amplitude input signals but does mean that the signal dependent scaling should have minimal effect on the value of Cout—hence operation of the calibration loop (if active) should not be affected.

Figure 31:
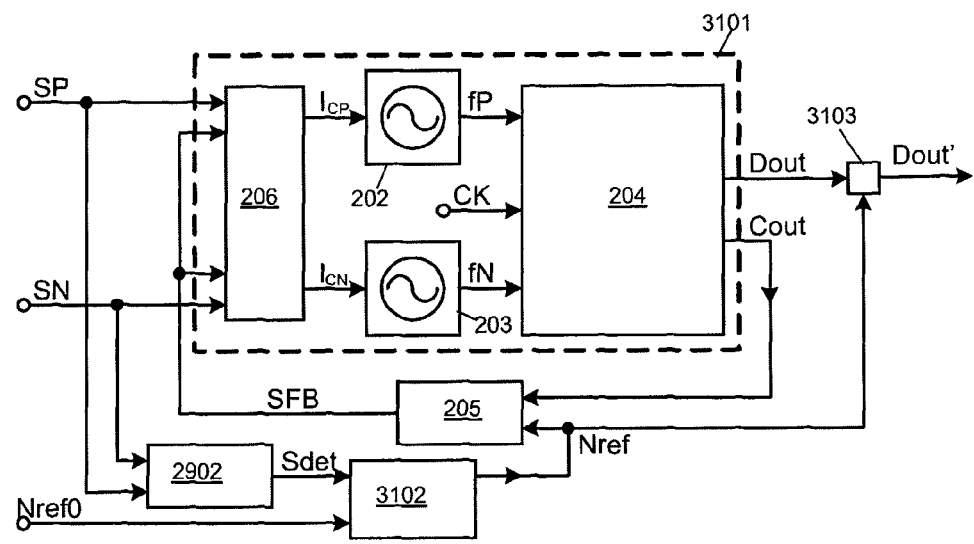
FIG. 31 illustrates an ADC according to a further embodiment of the invention with regulation circuitry for calibration and overload protection.

Alternatively the first digital signal Dout could be scaled as discussed above but to reverse the effect of the signal dependent scaling. FIG. 31 shows an embodiment of an ADC 3101 where the output is scaled to reverse the event of signal dependent scaling at the front end.

In this embodiment the level detect signal Sdet produced by amplitude module 2902 is received by a scaler 3102 which scales the value of a base reference count value Nref0 to provide the Nref signal used by comparison circuitry 205. Reducing the resulting value of Nref from its base value when a large signal is detected will result in the ADC characteristics being modulated to reduce the corresponding control currents.

Imagine that the calibration loop is active and stable such that the value of Cout is substantially equal to Nref and that a scaling factor of unity is applied, such that Nref=Nref0. If a large signal amplitude is detected the scaling factor may be reduced such that the value of Nref is reduced. The value of Gout will then be greater than the value of Nref, indicating that the present centre frequency is too high. Circuitry 205 will therefore generate a regulation signal SFB that results in the centre frequency of the oscillators being reduced. The use of Nref to provide the signal dependent scaling will introduce delay due to any loop filter in the feedback path, but may also smooth any coarse adjustment steps.

This dynamic adjustment of Nref will deliberately reduce the VCO gain, and hence the scale factor of the ADC for the first digital signal Dout. Scaler 3103 is therefore provided to scale Dout to compensate, in this example according to the modulated Nref. The scaler may be a suitable divider as discussed previously.

Note that the ideas of modulating the ADC properties based on signal level to avoid clipping may be most applicable to modulation of the oscillator operating properties to maintain substantially linear non-saturated operation. However it is possible in some embodiments that the counters may reach a maximum count value before the oscillators saturate or behave non-linearly. In this case it may be wished to simply modulate the clock frequency for the counters based on the input signal to reduce the count period for large input signal amplitudes.

ADCs according to the present invention may be used in a variety of different application and may, for instance be used in audio applications. When implemented as an integrating ADC the ADC may be used in a delta-sigma ADC.

One suitable application of non-integrating ADC embodiments is as a feedback element in Class-D amplifier. Embodiments of the present invention may be implemented as a continuous-time input ADC to accurately digitise Class D output waveform. Use of an ADC in this way allows a digital loop filter, which is advantageous for small-geometry. The ADC may be calibrated, possibly continuously to maintain the same overall amplifier gain despite any variations in power stage supply voltage, such as may be experienced in a battery powered apparatus.

In general the embodiments of the present invention therefore allow regulation of ADC operation to provide control of, and/or correction for variation in, oscillator operating conditions in controlled oscillator based ADCs. Regulation circuitry may modulate the operating conditions of the ADC to correct for unwanted variations in oscillator transfer characteristic and/or cope with high amplitude signals with loss of signal.

The ADC may be arranged as part of an audio and/or signal processing circuit, for instance an audio circuit which may be provided in a host device. An ADC according to an embodiment may be implemented as an integrated circuit and may be implemented in a host device, especially a portable and/or battery powered host device such as a mobile telephone, an audio player, a video player, a PDA, a mobile computing platform and/or a games device for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

What is claimed is:

1. An analogue-to-digital converter for receiving a differential analogue input signal comprising first and second input analogue signals, wherein said first and second analogue input signals exhibit equal and opposite modulations about a reference signal level, the converter comprising:
controlled oscillator circuitry for generating first and second pulse streams with pulse rates dependent on the first and second input signals respectively;
difference circuitry, responsive to a clock signal, for generating a first digital signal based on the difference in number of pulses of the first and second pulse streams; and regulation circuitry for generating a regulation signal for modulating the operating conditions of the analogue-to-digital converter
wherein the regulation circuitry is configured to generate a first value based on the number of pulses of the first and/or second pulse streams; and
the regulation signal is based on the first value.

2. An analogue-to-digital converter as claimed in claim 1 wherein the regulation circuitry is configured to generating said regulation signal to modulate the operating conditions of the oscillator circuitry so as to modulate the pulse rates of the first and second pulse streams.

3. An analogue-to-digital converter as claimed in claim 1 wherein the first value is a signal independent value derived from the number of pulses of first and/or second pulse streams.

4. An analogue-to-digital converter as claimed in claim 1 wherein the first value is the sum or average of the number of pulses of the first and second pulse streams.

5. An analogue-to-digital converter as claimed in claim 4 wherein said regulation circuitry comprises filter circuitry for filtering the first value and/or the result of the comparison to provide the regulation signal.

6. An analogue-to-digital converter as claimed in claim 1 wherein the regulation circuitry is configured to compare the first value to a reference value and the regulation signal is based on the result of said comparison.

7. An analogue-to-digital converter as claimed in claim 1 wherein the analogue-to-digital converter is configured as an integrating converter such that the first digital signal is based on the integrated difference in number of pulses of the first and second pulse streams.

8. An analogue-to-digital converter as claimed in claim 7 wherein the first value is based on the integrated number of pulses of the first and/or second pulse streams and wherein the regulation circuitry is configured to differentiate the first value and compare the differentiated value with a reference value.

9. An analogue-to-digital converter as claimed in claim 1 comprising control circuitry for adjusting the first and second input signals received by the controlled oscillator circuitry based on said regulation signal.

10. An analogue-to-digital converter as claimed in claim 9 wherein said control circuitry controls the common mode of the first and second input signals based on the regulation signal.

11. An analogue-to-digital converter as claimed in claim 1 wherein the controlled oscillator circuitry comprises at least one current controlled oscillator, and the converter comprises:
voltage to current conversion circuitry for converting the first and second input signals into first and second input current signals respectively; and
current control circuitry for modulating the first and second input current signals based on the regulation signal.

12. An analogue-to-digital converter as claimed in claim 1 wherein the controlled oscillator circuitry comprises at least one dual-input voltage controlled oscillator for producing a pulse stream at a pulse rate based on the voltages at both of said dual inputs wherein regulation signal is supplied to one of said inputs.

13. An analogue-to-digital converter as claimed in claim 1 wherein the first value is based on the number of pulses of the first pulse stream and is conditioned to be signal independent.

14. An analogue-to-digital converter as claimed in claim 1 wherein the regulation circuitry is configured to perform regulation on start-up and/or in response to a control signal.

15. An analogue-to-digital converter as claimed in claim 1 wherein the difference circuitry is responsive to a clock signal and wherein the regulation circuitry further generates a second additional regulation signal based on the first value for modulating the clock signal period.

16. An analogue-to-digital converter as claimed in claim 1 wherein the regulation circuitry is configured to generate the regulation signal to modulate the first digital signal to provide a digital output.

17. An analogue-to-digital converter as claimed in claim 16 wherein the regulation circuitry is configured to scale the first digital signal based on the regulation signal.

18. An analogue-to-digital converter as claimed in claim 17 wherein the regulation signal is inversely proportional to the first value.

19. An analogue-to-digital converter as claimed in claim 1 wherein the regulation circuitry is configured to generate the regulation signal to modulate the clock signal period.

20. An electronic device comprising an analogue-to-digital converter as claimed in claim 1.

21. An electronic device as claimed in claim 20 wherein said electronic device is at least one of: a portable device; a battery powered device; a communications device; a computing device; a mobile telephone; an audio player; a video player, a PDA device; a mobile computing platform; or a games device.

22. An analogue-to-digital converter for receiving first and second analogue input signals, comprising;
controlled oscillator circuitry for generating first and second pulse streams with pulse rates dependent on the first and second input signals respectively;
difference circuitry responsive to a clock signal for generating a first digital signal based on the difference in number of pulses of the first and second pulse streams; and
regulation circuitry for generating a regulation signal for modulating the operating conditions of the controlled oscillator circuitry so as to modulate the pulse rates of the first and second pulse streams and/or for modulating the clock signal;
wherein the regulation signal varies based on an indication of the amplitude of the first and/or second input signals.

23. An analogue-to-digital converter as claimed in claim 22 wherein said indication of amplitude is the differential input signal level.

24. An analogue-to-digital converter as claimed in claim 22 comprising a level detector for detecting the differential input signal level of the first and second input signals and outputting a level detect signal as said indication of the amplitude of the first and/or second input signals.

25. An analogue-to-digital converter as claimed in claim 24 wherein, when the differential input signal level is within at least a first range, the level detect signal varies in accordance with the differential input signal level.

26. An analogue-to-digital converter as claimed in claim 24 wherein the level detector is configured such that the level detect signal varies based on whether the differential input signal level is above a predetermined threshold.

27. An analogue-to-digital converter as claimed in claim 22 comprising control circuitry for adjusting the signal level of the first and/or second input signals received by the controlled oscillator circuitry based on said regulation signal.

28. An analogue-to-digital converter as claimed in claim 22 wherein the regulation circuitry further comprises output modulation circuitry for modulating the first digital signal to provide a digital output signal, wherein the output modulation circuitry is responsive to the modulated regulation signal to compensate for any modulation in the first digital signal due to the indication of amplitude of the first and second input signals.

29. An analogue-to-digital converter as claimed in claim 22 wherein the regulation circuitry is configured to generate a first value based on the number of pulses of the first and/or second pulse streams and said regulation signal is based on the first value and modulated based on the indication of the amplitude of the first and/or second input signals.

30. An analogue-to-digital converter for receiving first and second input analogue signals providing a differential signal, wherein both of said first and second analogue input signals vary in accordance with said differential signal, the converter comprising;
- controlled oscillator circuitry for generating first and second pulse streams with pulse rates dependent on the first and second input signals respectively;
- difference circuitry for generating a first digital signal based on the difference in number of pulses of the first and second pulse streams; and
- gain control circuitry for modulating the operation of the converter so as to modulate the gain of the converter;
- wherein the gain control circuitry modulates the operation of the converter based on the number of pulses of the first and/or second pulse streams.

* * * * *